US009853243B2

(12) United States Patent
Chen

(10) Patent No.: US 9,853,243 B2
(45) Date of Patent: Dec. 26, 2017

(54) FLEXIBLE DISPLAY AND METHOD FOR FABRICATING THE SAME

(71) Applicant: INDUSTRIAL TECHNOLOGY RESEARCH INSTITUTE, Hsinchu (TW)

(72) Inventor: Kuang-Jung Chen, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 48 days.

(21) Appl. No.: 14/899,939

(22) PCT Filed: Jul. 5, 2013

(86) PCT No.: PCT/CN2013/000824
§ 371 (c)(1),
(2) Date: Dec. 18, 2015

(87) PCT Pub. No.: WO2015/000095
PCT Pub. Date: Jan. 8, 2015

(65) Prior Publication Data
US 2016/0141552 A1    May 19, 2016

(51) Int. Cl.
*H01L 21/00* (2006.01)
*H01L 51/52* (2006.01)
(Continued)

(52) U.S. Cl.
CPC ........ *H01L 51/5253* (2013.01); *H01L 27/322* (2013.01); *H01L 51/003* (2013.01);
(Continued)

(58) Field of Classification Search
CPC ... H01L 51/5253; H01L 51/56; H01L 51/003; H01L 51/0097; H01L 27/322; H01L 51/524; H01L 51/5246
(Continued)

(56) References Cited

U.S. PATENT DOCUMENTS 4,451,759 A    5/1984  Heynisch
5,267,884 A   12/1993  Hosogi
(Continued)

FOREIGN PATENT DOCUMENTS

CN    101170125 A    4/2008
CN    101176029 A    5/2008
(Continued)

OTHER PUBLICATIONS

Lewis et al., "Thin-Film Permeation-Barrier Technology for Flexible Organic Light-Emitting Devices", IEEE Journal of Selected Topics in Quantum Electronics, vol. 10, No. 1, Jan./Feb. 2004, pp. 45-57.
(Continued)

*Primary Examiner* — Hung Vu
(74) *Attorney, Agent, or Firm* — Birch, Stewart, Kolasch & Birch, LLP

(57) ABSTRACT

The invention provides a flexible display and method for fabricating the same. The flexible display includes: a first flexible substrate and an oppositely disposed second flexible substrate; a TFT layer and an emitting unit, sequentially formed on the first flexible substrate; a color filter layer and an overcoat formed on the second flexible substrate; a fill formed between the first flexible substrate and the second flexible substrate; and a dam formed between the first flexible substrate and the second flexible substrate and surrounding the fill.

19 Claims, 35 Drawing Sheets

(51) Int. Cl.
*H01L 51/00* (2006.01)
*H01L 27/32* (2006.01)
*H01L 51/56* (2006.01)

(52) U.S. Cl.
CPC ........ *H01L 51/0097* (2013.01); *H01L 51/524* (2013.01); *H01L 51/5246* (2013.01); *H01L 51/56* (2013.01); *H01L 2227/323* (2013.01); *H01L 2227/326* (2013.01); *H01L 2251/5338* (2013.01)

(58) Field of Classification Search
USPC ..... 438/30, 82, 99, 113, 455, 458, 462–464; 257/40, 59, 72, 620
See application file for complete search history.

(56) References Cited

U.S. PATENT DOCUMENTS

| | | | |
|---|---|---|---|
| 5,312,279 | A | 5/1994 | Jang |
| 5,609,649 | A | 3/1997 | Junino et al. |
| 5,692,942 | A | 12/1997 | Hill |
| 5,735,720 | A | 4/1998 | Gärtner et al. |
| 5,836,798 | A | 11/1998 | Dannoux et al. |
| 5,910,703 | A | 6/1999 | Kuo et al. |
| 6,004,830 | A | 12/1999 | Potter |
| 6,083,069 | A | 7/2000 | Lu |
| 6,352,462 | B2 | 3/2002 | Hamada |
| 6,361,390 | B1 | 3/2002 | Sreeram et al. |
| 6,508,685 | B1 | 1/2003 | Lee et al. |
| 6,626,720 | B1 | 9/2003 | Howard et al. |
| 6,663,454 | B2 | 12/2003 | Russ et al. |
| 6,783,416 | B2 | 8/2004 | Lee et al. |
| 6,962,514 | B2 | 11/2005 | Gross et al. |
| 7,033,238 | B2 | 4/2006 | Cathey et al. |
| 7,247,073 | B2 | 7/2007 | Gu et al. |
| 7,326,095 | B2 | 2/2008 | Miura et al. |
| 7,462,088 | B2 | 12/2008 | Cathey et al. |
| 7,462,981 | B2 | 12/2008 | Hwang |
| 7,652,428 | B2 | 1/2010 | Hwang et al. |
| 7,854,640 | B2 | 12/2010 | Yamazaki |
| 8,040,038 | B2 | 10/2011 | Brunetti et al. |
| 8,093,512 | B2 | 1/2012 | Chen et al. |
| 2004/0232413 | A1 | 11/2004 | Yamazaki et al. |
| 2007/0134849 | A1 | 6/2007 | Vanfleteren et al. |
| 2009/0224411 | A1 | 9/2009 | Chen |
| 2010/0068483 | A1 | 3/2010 | Leu et al. |
| 2010/0202076 | A1 | 8/2010 | Liu et al. |
| 2010/0308335 | A1 | 12/2010 | Kim et al. |
| 2010/0323576 | A1 | 12/2010 | Hsiao et al. |
| 2011/0008921 | A1 | 1/2011 | Chen et al. |
| 2012/0169229 | A1 | 7/2012 | You et al. |
| 2013/0011969 | A1* | 1/2013 | Chen .................... H01L 51/003 438/111 |

FOREIGN PATENT DOCUMENTS

| | | |
|---|---|---|
| CN | 101501832 A | 8/2009 |
| CN | 101911158 A | 12/2010 |
| CN | 101937157 A | 1/2011 |
| CN | 102509719 A | 6/2012 |
| CN | 102869203 A | 1/2013 |
| TW | I265606 B | 11/2006 |
| TW | 201018307 A1 | 5/2010 |
| TW | 201037799 A1 | 10/2010 |
| TW | 201117158 A1 | 5/2011 |
| WO | WO 2015/000095 A1 | 1/2015 |

OTHER PUBLICATIONS

International Search Report issued in PCT/US2013/000824, dated Apr. 3, 2014.

Kim et al., "Low Temperature Color Filter on Thin Film Encapsulation Active Matrix OLED (AMOLED) for Flexible Display", IDW '10, OLED5-4, 2010, pp. 1119-1122.

Lungenschmied et al., "Flexible Encapsulation for Organic Solar Cells", Photonics for Solar Energy Systems, vol. 6197, May 2006, pp. 619712-1-619712-8.

Nakano et al., "Highly Reliable a-IGZO TFTs on a Plastic Substrate for Flexible AMOLED", IDW '11, FLX1/AMD2-3, Sep. 2012, pp. 1271-1274.

Office Action issued in Taiwanese Patent Application No. 101131479, dated Dec. 8, 2014.

Office Action issued in Chinese Patent Application No. 201210488394.0, dated Sep. 22, 2015.

* cited by examiner

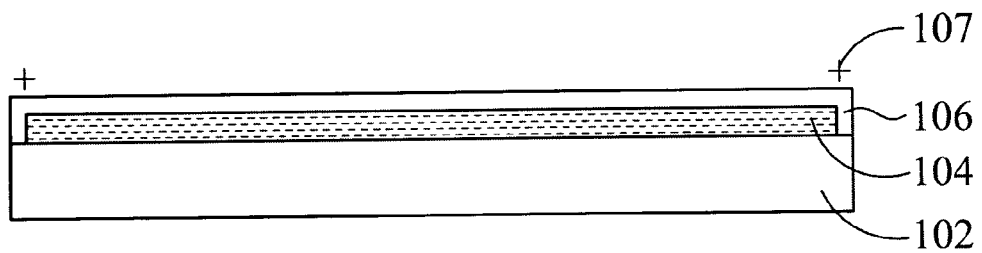
FIG. 2'A
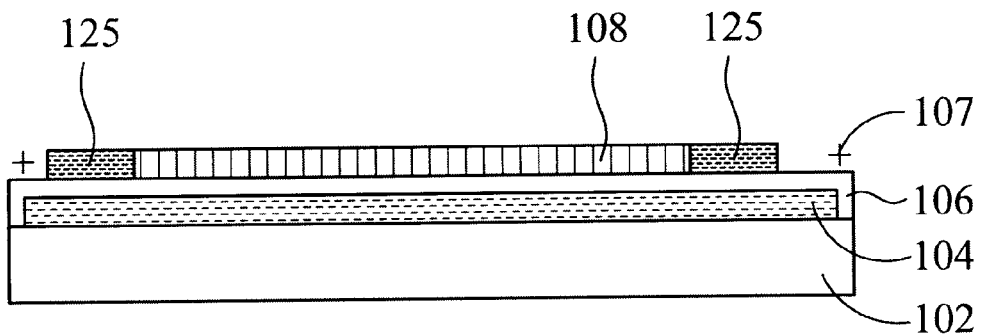
FIG. 2'B
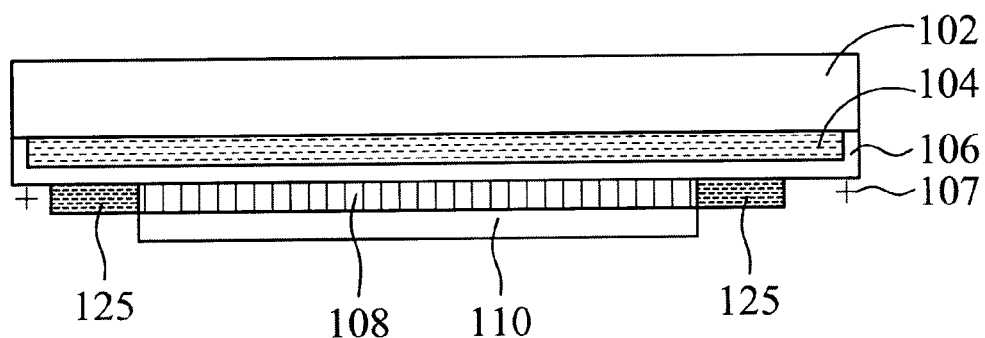
FIG. 2'C

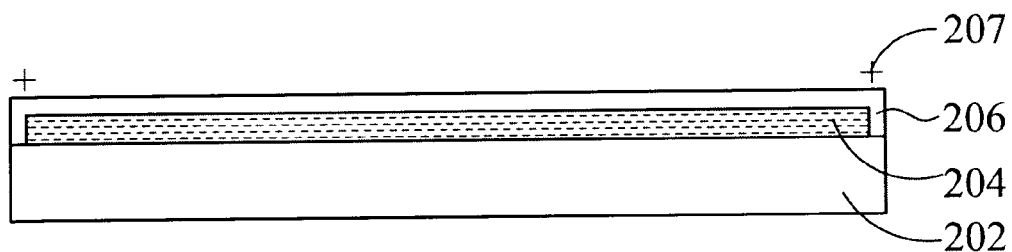
FIG. 2'D
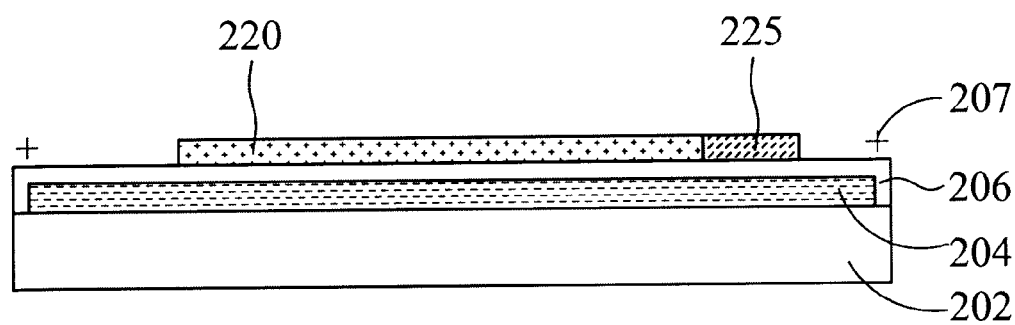
FIG. 2'E
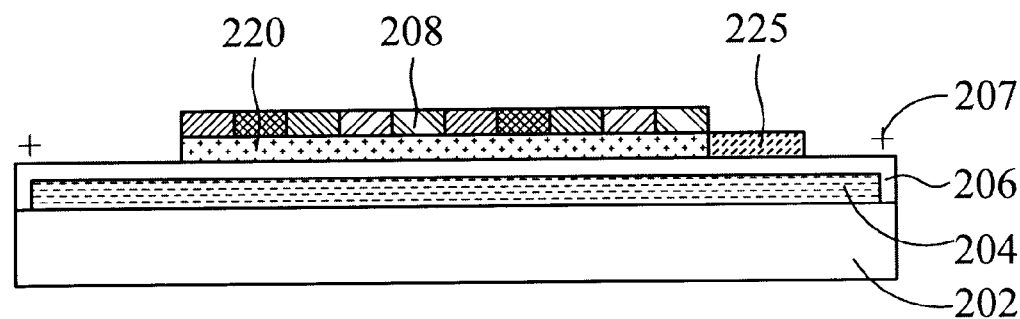
FIG. 2'F

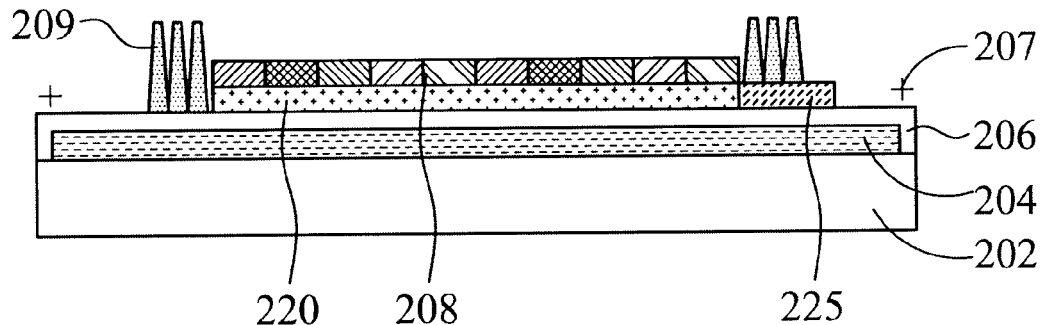
FIG. 2'G
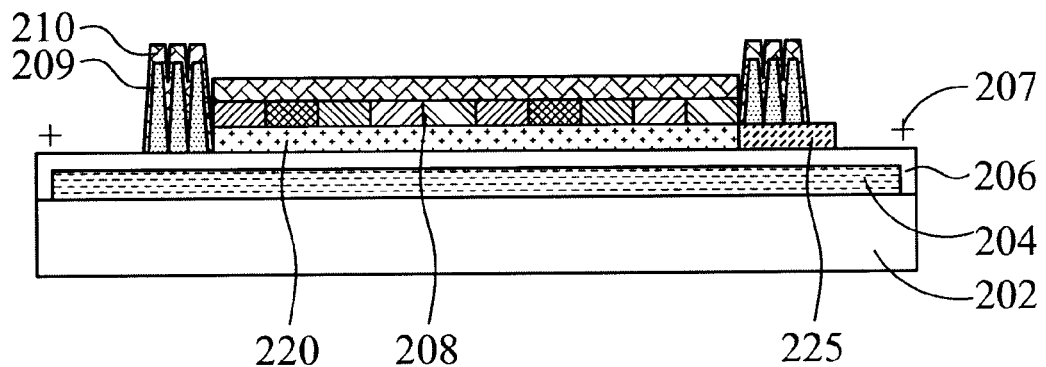
FIG. 2'H
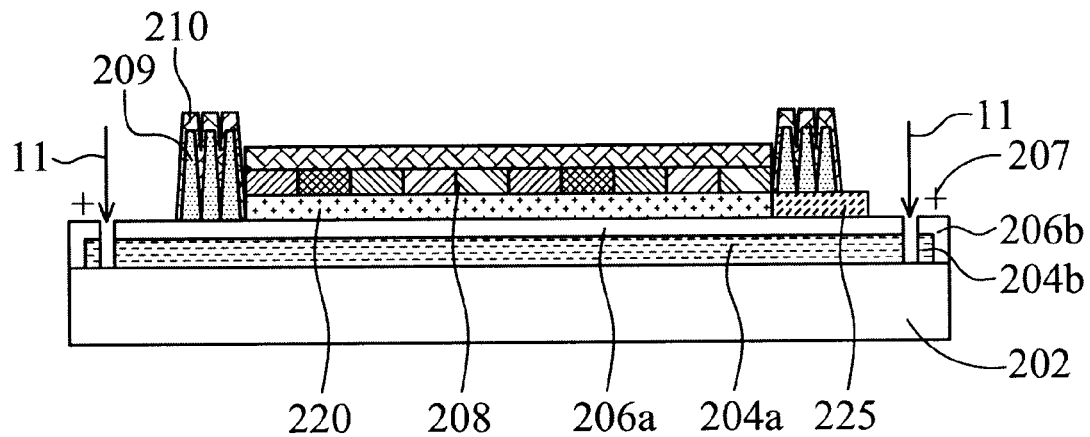
FIG. 2'I

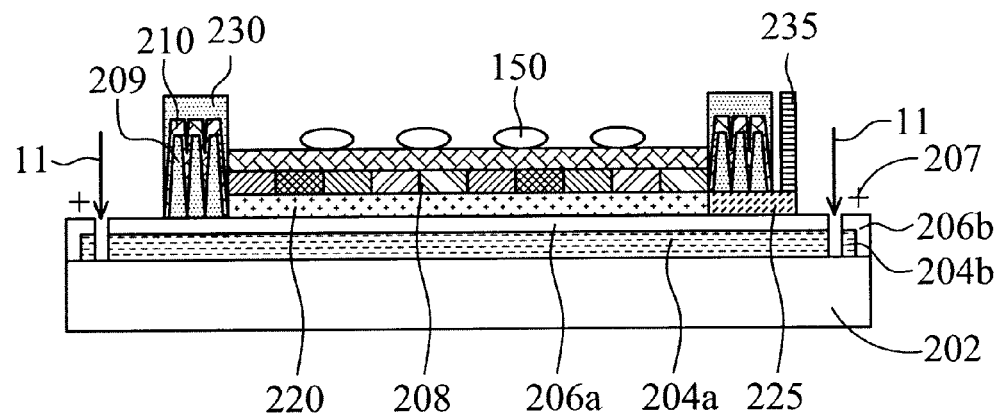
FIG. 2'J
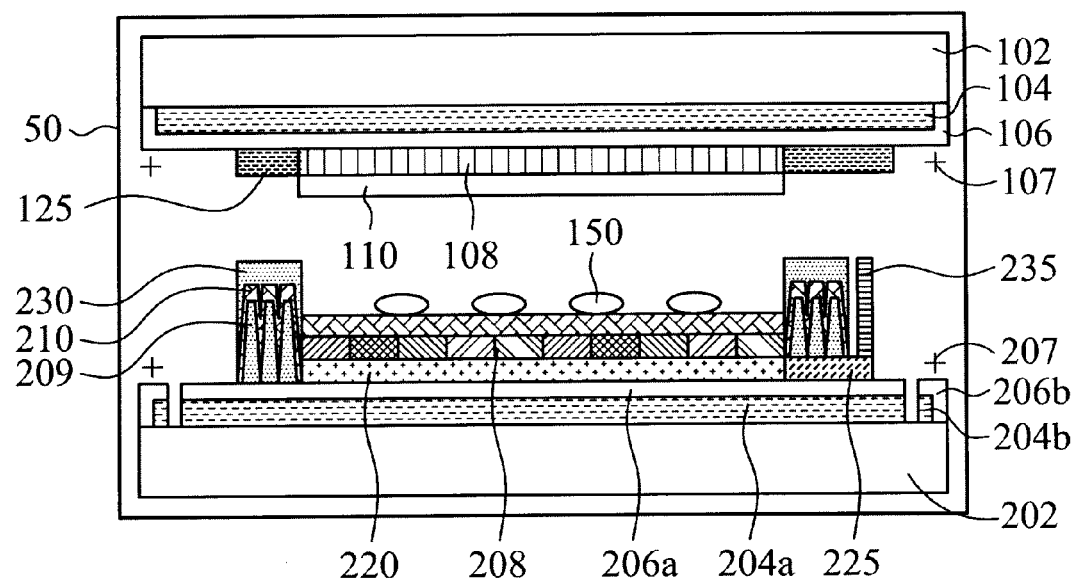
FIG. 2'K

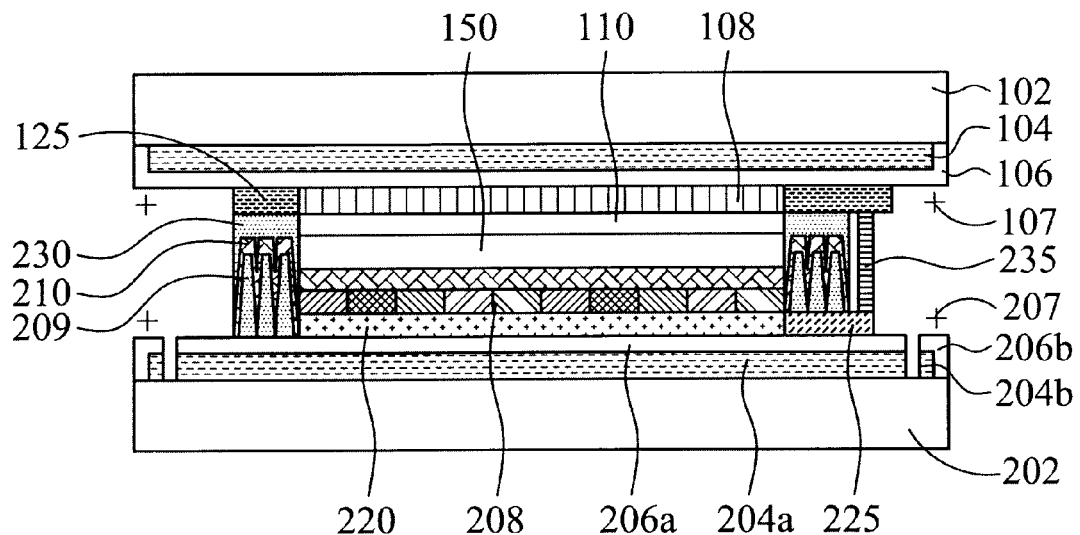
FIG. 2'L
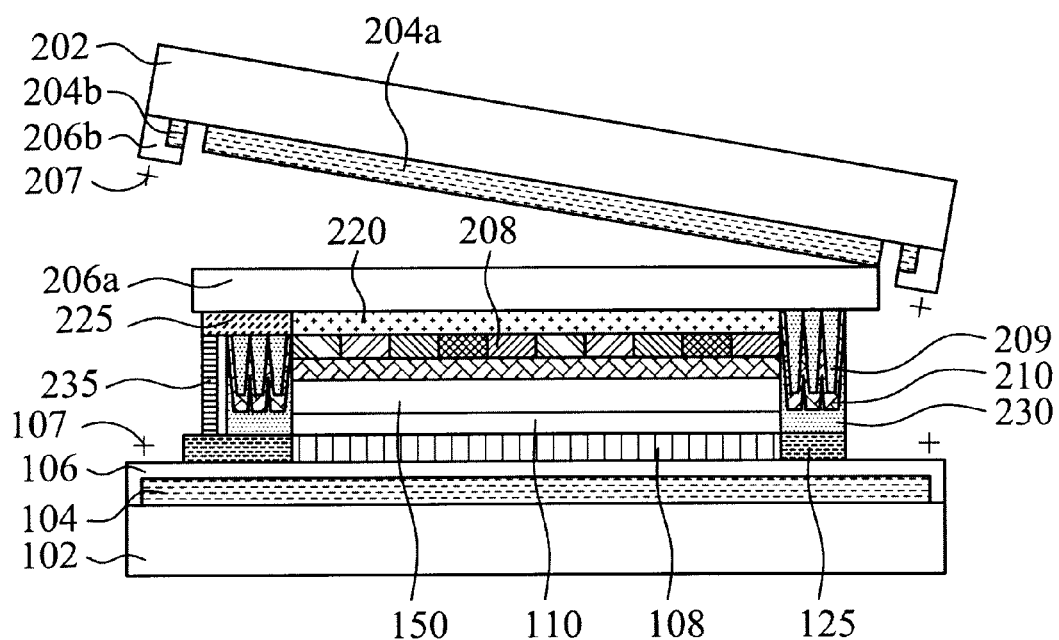
FIG. 2'M

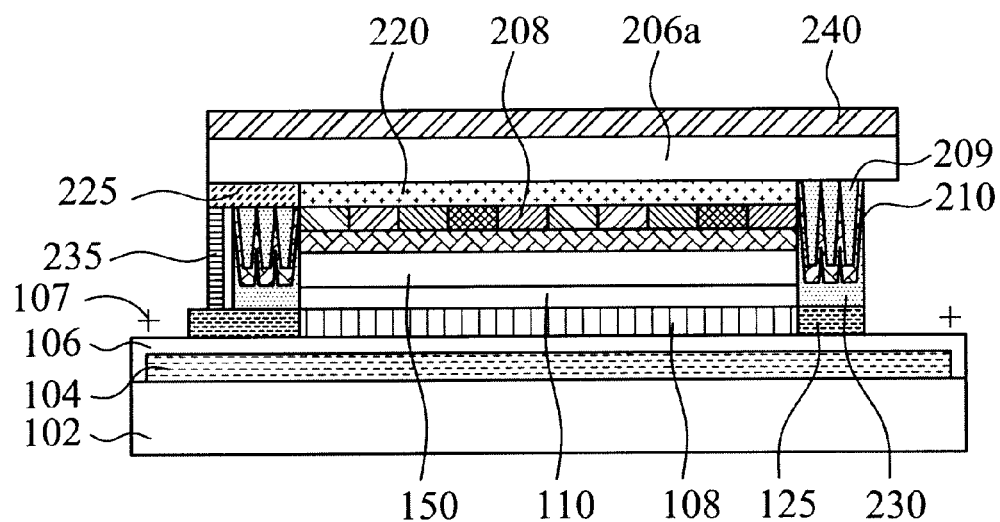
FIG. 2'N
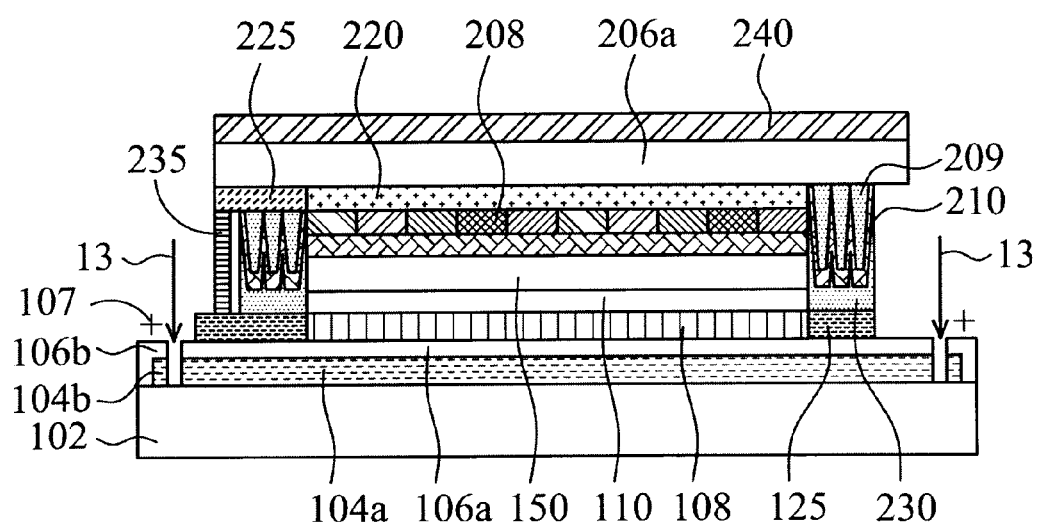
FIG. 2'O

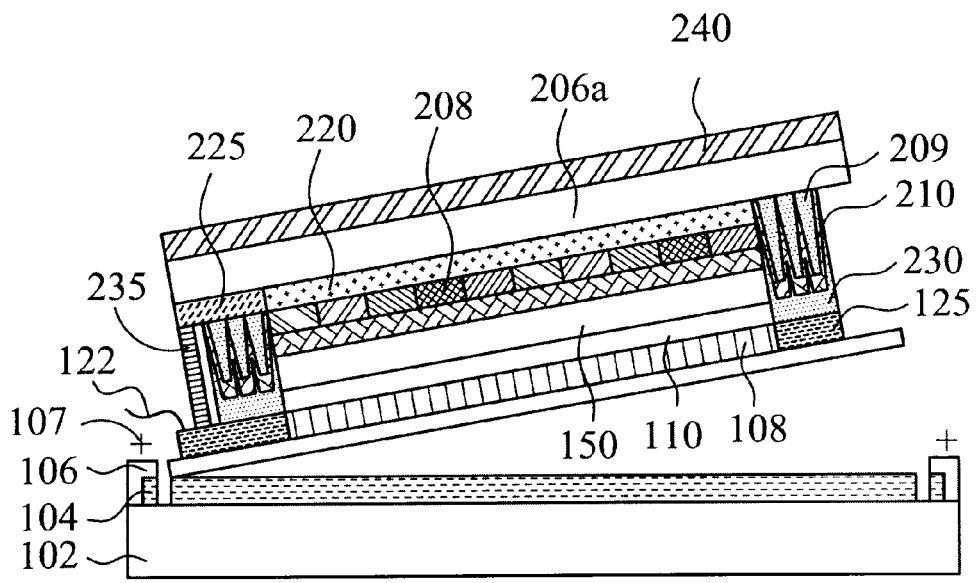
FIG. 2'P
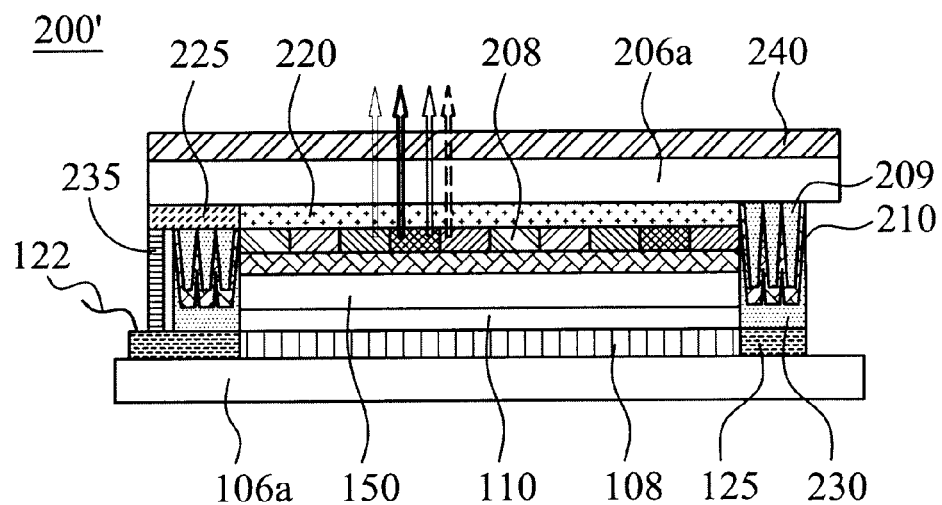
FIG. 2'Q

FLEXIBLE DISPLAY AND METHOD FOR FABRICATING THE SAME

TECHNICAL FILED

The present disclosure relates to a flexible electronic device, and in particular, relates to a flexible display and a method for fabricating the same.

BACKGROUND

Consumer electronic applications are becoming increasingly diverse with the rapid progress of science and technology. Light, thin, short and small electronic products are being demanded. Thus, flexible electronic devices are being developed.

In various flexible electronic devices, the flexible displays (such as organic light emitting diode (OLED) or liquid crystal display (LCD)) not only have a light weight, but are also thin. The flexible displays have features of flexibility and are not easily broken. Therefore, the development of flexible displays has become increasingly important.

During fabrication of flexible electronic devices, the flexible displays are firstly formed on a flexible substrate with a glass rigid carrier substrate. Then, the flexible displays are taken out of the rigid carrier substrate.

When the flexible displays are fabricated by a sheet-to-sheet process, and the flexible displays are formed between two rigid carrier substrates, performing a surface processing to a surface of the flexible displays and taking the flexible displays out of the two rigid carrier substrates are challenging. Meanwhile, the lifespan of flexible displays is reduced due to the penetration of water vapor and oxygen.

Therefore, there is a need to develop a flexible display and a method for fabricating the same. The flexible displays may be easily fabricated and could block the negative effects of moisture and oxygen.

SUMMARY

The disclosure provides a method for fabricating flexible displays, comprising: providing a first rigid carrier substrate, wherein a first de-bonding area, a first flexible substrate, a thin film transistor layer, and a light emitting unit are sequentially formed on the first rigid carrier substrate; providing a second rigid carrier substrate, wherein a second de-bonding area, a second flexible substrate, and a color filter layer are sequentially formed on the second rigid carrier substrate; performing a first cutting step to cut the second de-bonding area and the second flexible substrate, wherein the second flexible substrate is divided into a first portion and a second portion; assembling the first rigid carrier substrate and the second rigid carrier substrate together; fixing the first rigid carrier substrate, and separating the second de-bonding area from the first portion of the second flexible substrate to expose a surface of the first portion of the second flexible substrate, and removing the second rigid carrier substrate and the second de-bonding area; performing a second cutting step to cut the first de-bonding area and the first flexible substrate, wherein the first flexible substrate is divided into a third portion and a fourth portion; and separating the first de-bonding area from the third portion of the first flexible substrate, and removing the first rigid carrier substrate and the first de-bonding area to form the flexible display.

The disclosure also provides a flexible display, comprising: a first flexible substrate and a second flexible substrate, wherein the first flexible substrate is disposed oppositely to the second flexible substrate; a thin film transistor layer and a light emitting unit, sequentially formed on the first flexible substrate; a color filter layer formed on the second flexible layer; and a fill formed between the light emitting unit and the color filter.

The disclosure also provides a method for fabricating flexible displays, comprising: providing a first rigid carrier substrate, wherein a first de-bonding area, a first flexible substrate, a thin film transistor layer, a color filter layer, and a light emitting unit are sequentially formed on the first rigid carrier substrate, and an area of the first de-bonding area is smaller than or equal to an area of the first flexible substrate; providing a second rigid carrier substrate, wherein a second de-bonding area and a second flexible substrate are sequentially formed on the second rigid carrier substrate, and an area of the second de-bonding area is smaller than or equal to an area of the second flexible substrate; performing a first cutting step to cut the first de-bonding area and the first flexible substrate, wherein the first flexible substrate is divided into a first portion and a second portion; assembling the first rigid carrier substrate and the second rigid carrier substrate together, wherein a fill is formed between the first rigid carrier substrate and the second rigid carrier substrate; fixing the second rigid carrier substrate, and separating the first de-bonding area from the first portion of the first flexible substrate to expose a surface of the first portion of the first flexible substrate, and removing the first rigid carrier substrate; performing a second cutting step to cut the second de-bonding area and the second flexible substrate, wherein the second flexible substrate is divided into a third portion and a fourth portion, and wherein the thin film transistor layer is formed on the third portion of the second flexible substrate; and separating the second de-bonding area from the third portion of the second flexible substrate, and removing the second rigid carrier substrate and the second de-bonding area to form the flexible display.

The disclosure provides a flexible display, comprising: a first flexible substrate and a second flexible substrate, wherein the first flexible substrate is disposed oppositely to the second flexible substrate; a thin film transistor layer, a color filter layer and a light emitting unit, formed on the first flexible substrate; and a fill formed between the light emitting unite and the second flexible substrate. A detailed description is given in the following embodiments with reference to the accompanying drawings.

BRIEF DESCRIPTION OF THE DRAWING

For a more complete understanding of the present disclosure, and the advantages thereof, reference is now made to the following descriptions taken in conjunction with the accompanying drawings, in which:

FIG. 1N' shows a cross-sectional representations of a flexible display in accordance with an modified embodiment of the disclosure;

FIG. 2N' shows a cross-sectional representations of a flexible display in accordance with an modified embodiment of the disclosure;

FIG. 3L' shows a cross-sectional representations of a flexible display in accordance with an modified embodiment of the disclosure;

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1A:
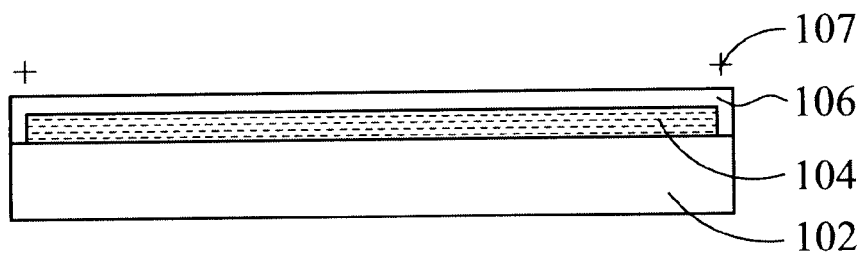
FIGS. 1A-1N show cross-sectional representations of various stages of fabricating a flexible display in accordance with a first embodiment of the disclosure.
Figure 1B:
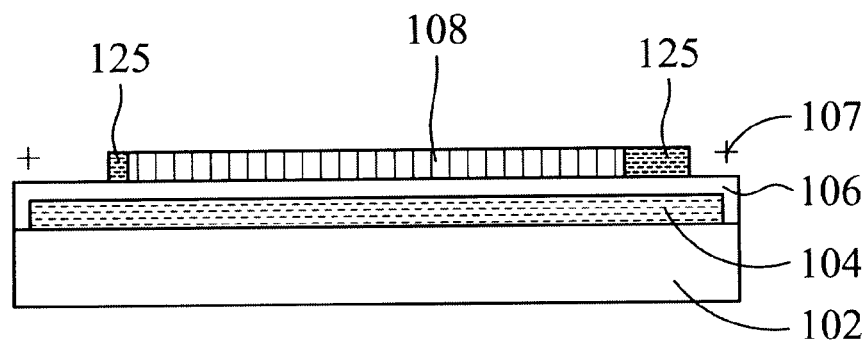
Figure 1C:
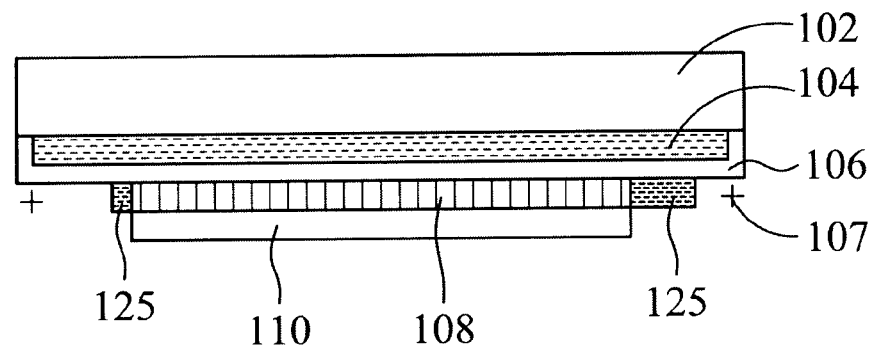
Figure 1D:
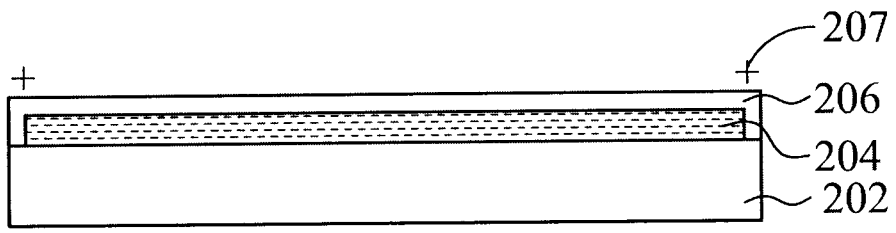
Figure 1E:
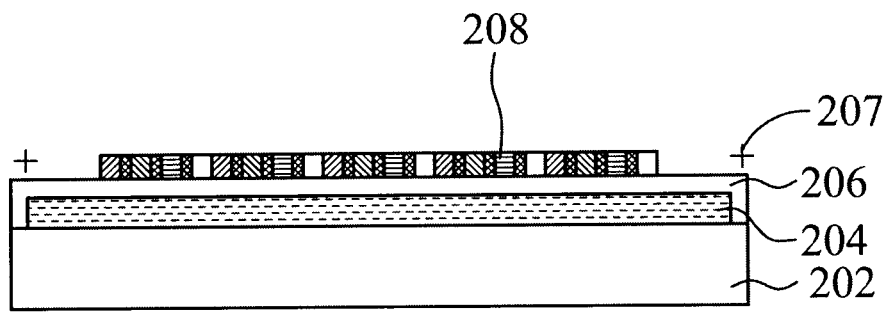
Figure 1F:
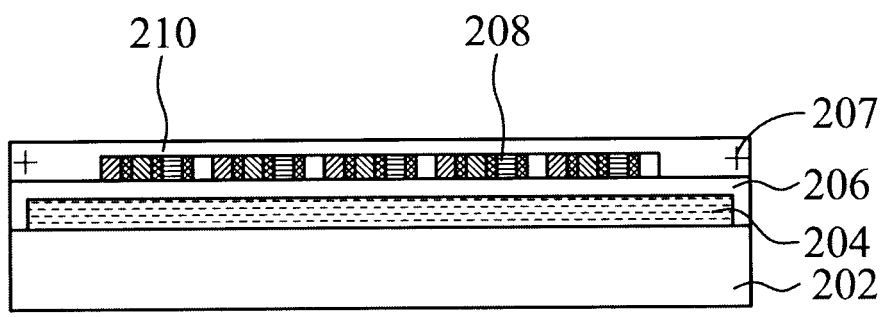
Figure 1G:
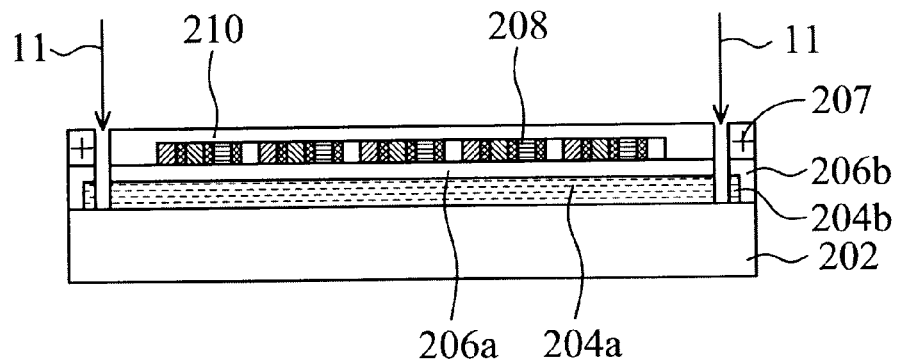
Figure 1H:
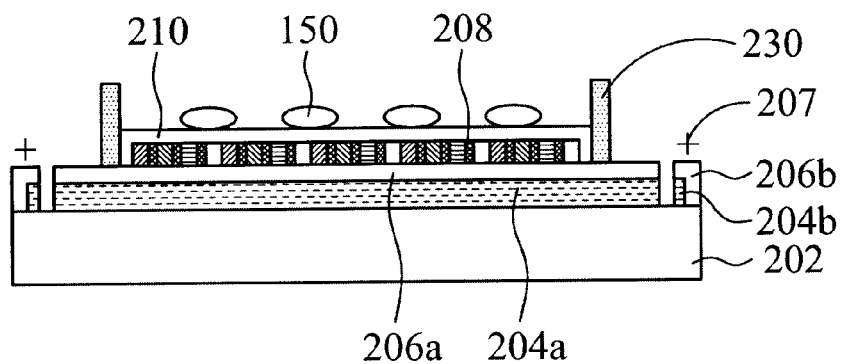
Figure 1I:
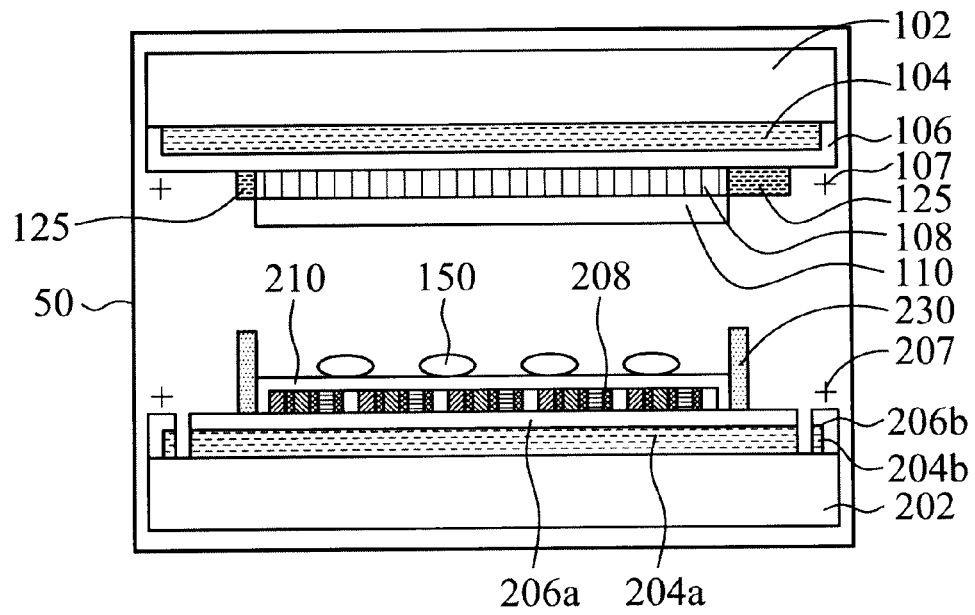
Figure 1J:
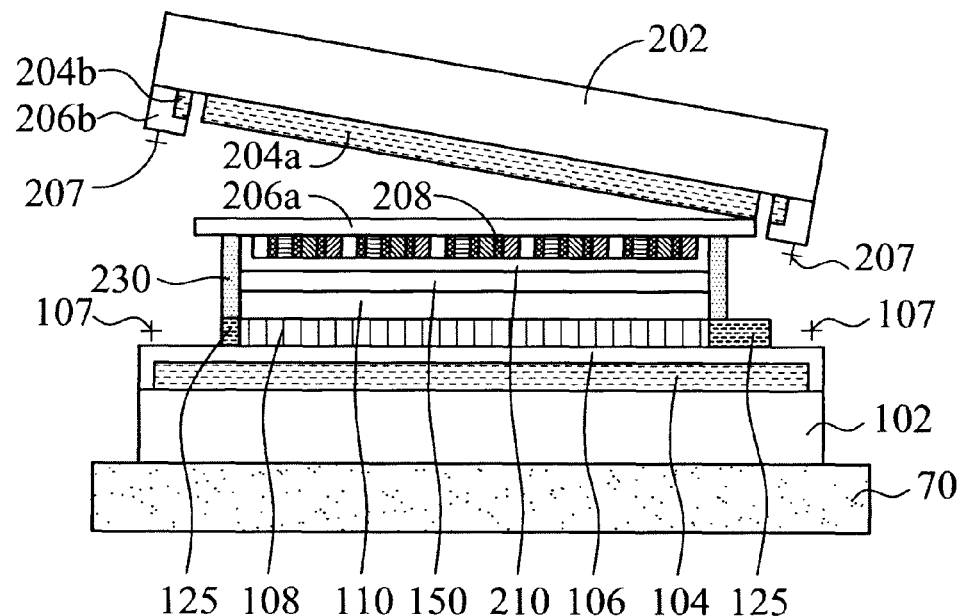
Figure 1K:
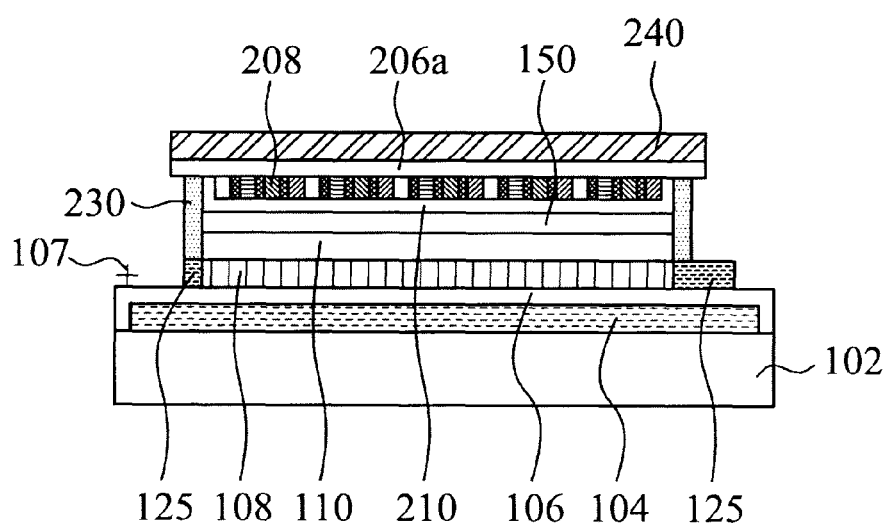
Figure 1L:
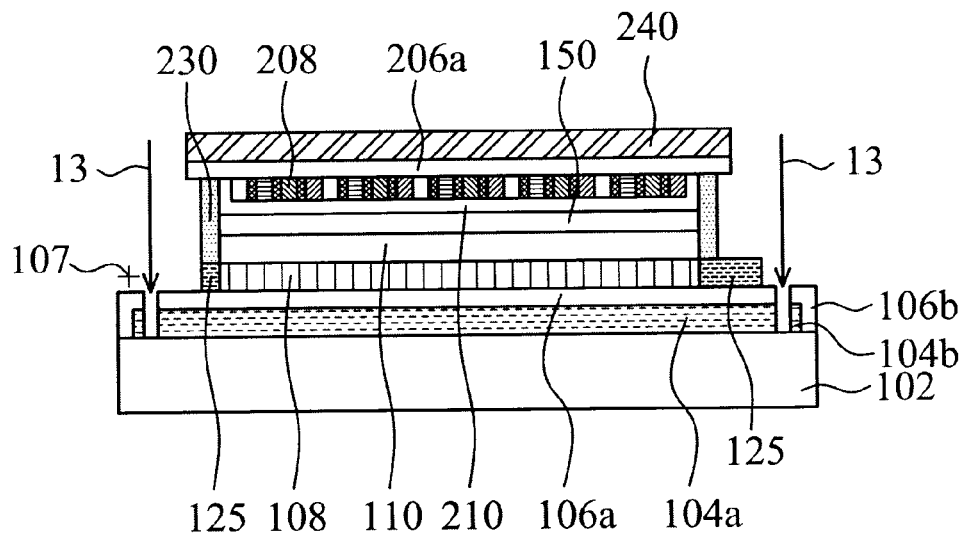
Figure 1M:
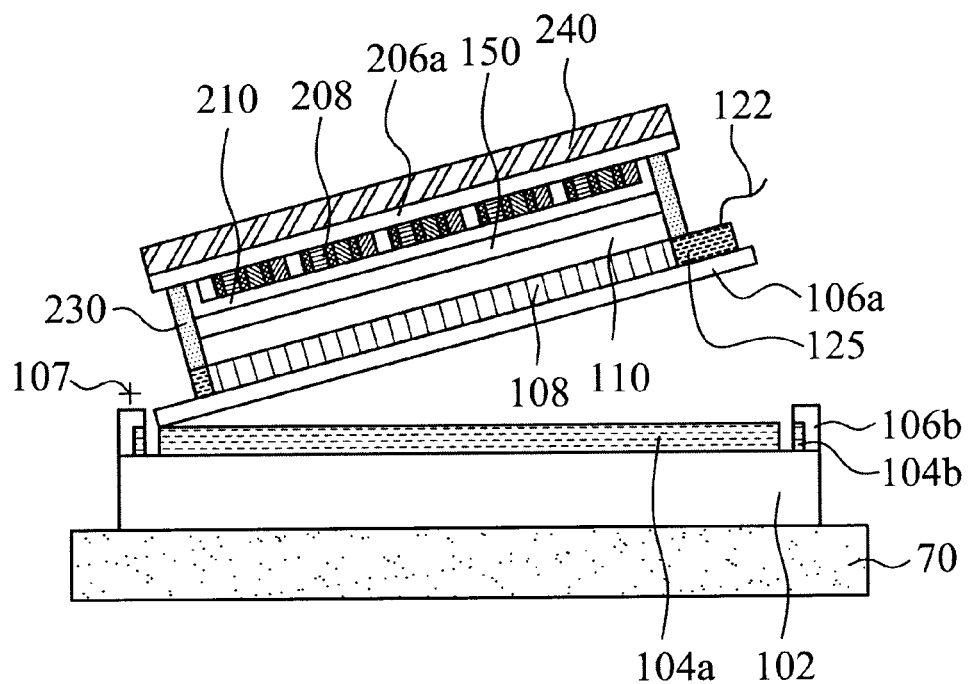
Figure 1N:
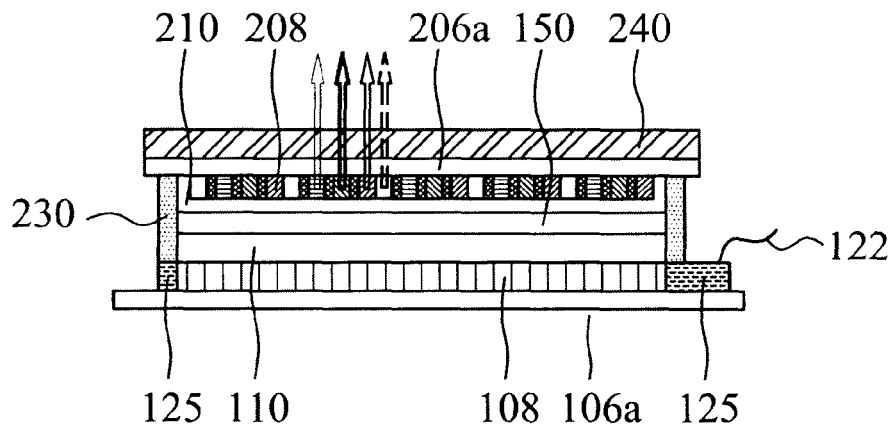
Figure 1N:
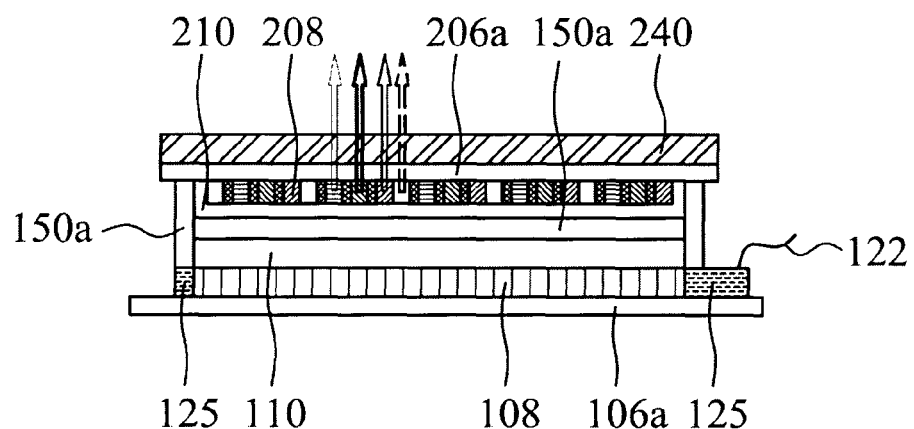

FIGS. 1A-1N show cross-sectional schematic representations of various stages of fabricating a flexible display in accordance with a first embodiment of the disclosure.

Referring to FIG. 1A, a first rigid carrier substrate 102 is provided, wherein a first de-bonding area 104 and a first flexible substrate 106 are sequentially formed on the first rigid carrier substrate 102, and an area of the first de-bonding area 104 is smaller than or equal to an area of the first flexible substrate 106.

Additionally, a first alignment mark 107 is formed on the first flexible substrate 106. For example, the material of the first alignment mark 107 is metal and the first alignment mark 107 is used to align two substrates in the following steps. The shape of the first alignment mark 107 comprises cross, circular, triangular or irregular shapes.

The first rigid carrier substrate 102 comprises glass substrate, silicon substrate, quartz substrate, sapphire substrate or metal substrate. In one embodiment, the first rigid carrier substrate 102 is a transparent substrate, such as glass substrate.

The first flexible substrate 106 is a plastic substrate and comprises polyimide (PI), polycarbonate (PC), polyethersulfone (PES), polyacrylate (PA), polynorbornene (PNB), polyetheretherketone, (PEEK), polyethylene naphthalate (PEN) or polyetherimide (PEI). In one embodiment, the material of the first flexible substrate 106 is polyimide (PI) substrate.

Referring to FIG. 1B, a thin film transistor layer (TFT layer) 108 is formed on the first flexible substrate 106, and a conductive line 125 is formed around the thin film transistor layer 108. The thin film transistor layer (TFT layer) 108 comprises a source electrode, drain electrode and gate electrode. The conductive line 125 is electrically connected to a flexible printed circuit (FPC) 122 bonding (shown in FIG. 1L).

Referring to FIG. 1C, a light emitting unit 110 is formed on the thin film transistor layer (TFT layer) 108. The light emitting unit 110 comprises a white organic light emitting diode (WOLED) or RGB organic light emitting diode (RGB OLED).

Referring to FIG. 1D, a second rigid carrier substrate 202 is provided, wherein a second de-bonding area 204 and a second flexible substrate 206 are sequentially formed on the second rigid carrier substrate 202, and an area of the second de-bonding area 204 is smaller than or equal to an area of the second flexible substrate 206. The material of the second rigid carrier substrate 202 is like that of the first rigid carrier substrate 102, and the material of the second flexible substrate 206 is like that of the first flexible substrate 106, and thus omitted for brevity.

Additionally, a second alignment mark 207 is formed on the second flexible substrate 206. For example, the material of the first alignment mark 107 is metal and the second alignment mark 207 is used to align two substrates in subsequent process steps. The shape of the second alignment mark 207 comprises cross, circular, triangular or irregular shapes.

Referring to FIG. 1E, a color filter layer 208 is formed on the second flexible substrate 206. The color filter layer 208 comprises a red (R) pixel, green (G) pixel, blue (B) pixel and white (W) blank pixel.

Before step of FIG. 1G is performed, it is optional that step of FIG. 1F is performed, wherein an overcoat 210 is formed on the color filter layer 208. The material of the overcoat 210 is an inorganic film having a moisture blocking function, such as silicon nitride, silicon oxide, alumina oxide or a combination of organic materials and inorganic materials. The function of the overcoat 210 is to reduce the long-time damage caused by solvents and small molecules from the color filter layer 208. The overcoat 210 is formed by chemical vapor deposition (CVD), sputter, atomic layer deposition (ALD), spin coating or dipping.

Referring to FIG. 1G, a first cutting step 11 is performed to cut the second de-bonding area 204 and the second flexible substrate 206, and the second de-bonding area 204 is divided into a first portion 204a and a second portion 204b, and the second flexible substrate 206 is divided into a first portion 206a and a second portion 206b. The color filter layer 208 is formed on the first portion 204a of the second de-bonding area 204 and on the first portion 206a of the second flexible substrate 206. Note that in FIG. 1G, the second alignment mark 207 is formed outside of the cutting line (see reference number 11). In other embodiment, the second alignment mark 207 is formed inside of the cutting line (see reference number 11).

The first cutting step 11 comprises cutting the second de-bonding areas 204 and the second flexible substrate 206 by irradiating a laser beam or a knife wheel.

In one embodiment, a carbon dioxide ($CO_2$) laser is used. The wavelength of the laser is about 10640 nm, the power of the laser is smaller than 50 Watt, and the rate of the laser is about 10 mm/s-60 mm/s.

In another embodiment, an IR laser is used. The wavelength of the IR laser is about 810 nm, the power of the laser is about 0.9-10 Watt, and the rate of the laser is about 0.2 mm/s-15 mm/s.

Before step of FIG. 1I is performed, it is optional that step of FIG. 1H is performed, wherein dam 230 and fill 150 are formed on the first portion 206a of the second flexible substrate 206, wherein the color filter layer 208 and the light emitting unit 110 are surrounded by dam 230 and fill 150 is located inside of the dam 230.

The material of dam 230 is an organic material or a combination of organic materials and inorganic materials, such as epoxy, a mixture of epoxy and inorganic materials. The material of fill 150 is an organic material, such as epoxy, acrylic type materials.

Referring to FIG. 1I, the first rigid carrier substrate 102 and the second rigid carrier substrate 202 are assembled, and dam 230 is formed between first flexible substrate 106 and the first portion 206a of the second flexible substrate 206. Additionally, fill 150 is formed between the color filter layer 208 and the light emitting unit 110.

Referring to FIG. 1N', in another embodiment, another kind of fill (such as sheet type comprehensive glue 150a) is formed between the first portion 206a of the second flexible substrate 206 and a third portion 106a of the first flexible substrate 106 when the dam 230 is not used. The sheet type comprehensive glue 150a is degassed under a low pressure and is heated to assemble the first portion 206a of the second flexible substrate 206 and the third portion 106a of the first flexible substrate 106.

The first rigid carrier substrate 102 and the second rigid carrier substrate 202 are assembled by the following steps. The first rigid carrier substrate 102 and the second rigid carrier substrate 202 are put in a vacuum chamber 50. The assembly of the first rigid carrier substrate 102 and the second rigid carrier substrate 202 are aligned by first alignment mark 107 and second alignment mark 207. The fill 150 is filled between the first portion 206a of the second flexible substrate 206 and the third portion 106a of the first flexible substrate 106.

Referring to FIG. 1J, the first rigid carrier substrate 102 is fixed, the second de-bonding area 204 is separated from the first portion 206a of the second flexible substrate 206 to expose a surface of the first portion 206a of the second flexible substrate 206, and the second rigid carrier substrate 202 and the second de-bonding area 204 are removed.

In one embodiment, the first rigid carrier substrate 102 is fixed by an immobile device 70, and the immobile device 70 is fixed by a vacuum method, a fixture or an electrostatic chucking method.

Note that in one embodiment, the first de-bonding areas 104 and the second de-bonding areas 204 are the tangible films, such as parylene, fluoro-containing polymer, polyimide, small organic molecules, metal film, mixture of organic materials and inorganic materials or the like. In another embodiment, the first de-bonding areas 104 and the second de-bonding areas 204 are intangible films. For example, the surface of the first rigid carrier substrate 102 and the second rigid carrier substrate 202 are roughened by a physical method, such as a chemical treatment, an etching, sand blast, or polishing method or the like, or are treated by a chemical compound, such as trimethylchlorosilane, thionyl chloride or the like.

Thus, when the first de-bonding areas 104 and the second de-bonding areas 204 are both tangible films, during the separation step, they may be left on the same side as the first rigid carrier substrate 102 and the second rigid carrier substrate 202, or on the same side as the first flexible substrate 106 or the second flexible substrate 206. A portion of the first de-bonding areas 104 is left on the first rigid carrier substrate 102 or the first flexible substrate 106. A portion of the second de-bonding areas 204 is left on the second rigid carrier substrate 202 or the second flexible substrate 206. In FIG. 1J, the second de-bonding areas 204 is left on the same side as the second rigid carrier substrate 202.

Before performing the step of FIG. 1L, the step of FIG. 1K may be optionally performed, after separating the second de-bonding area 204 from the first portion 206a of the second flexible substrate 206, a surface processing method is performed to a surface of the first portion 206a of the second flexible substrate 206.

The surface processing method comprises adhering a function layer 240 to the exposed surface of the first portion 206a of the second flexible substrate 206. The function layer 240 comprises barrier layers, polarizer films, anti reflectance coating layers, anti-scratch protective films, or touch panels or the like. The numbers of the function layer 240 is not limited to two layers. The numbers of the function layer 240 may be adjusted according to the actual application for those skilled in the art.

Referring to FIG. 1L, a second cutting step 13 is performed to cut the first de-bonding area 104 and the first flexible substrate 106, wherein the first de-bonding area 104 is divided into a third portion 104a and a fourth portion 104b, and the first flexible substrate 106 is divided into a third portion 106a and a fourth portion 106b, and wherein the thin film transistor layer 108 is formed on the third portion 106a of the first flexible substrate 106.

The second cutting step 13 comprises cutting the first de-bonding area 104 and the first flexible substrate 106 by a laser beam or a knife wheel.

Additionally, the conductive line 125 is exposed outside of dam 230, conductive line 125 is electrically connected to a flexible printed circuit (FPC) 122 bonding.

Referring to FIG. 1M, the first de-bonding area 104 is separated from the third portion 106a of the first flexible substrate 106, and the first rigid carrier substrate 102 and the first de-bonding area 104 are removed to form the flexible display 100.

FIG. 1N shows a cross-sectional schematic representation of a top emission flexible display 100. The flexible display 100 comprises the first flexible substrate 106 (106a) and the second flexible substrate 206 (206a), and wherein the first flexible substrate 106 (106a) is disposed oppositely to the second flexible substrate 206 (206a). The thin film transistor layer 108 and the light emitting unit 110 are sequentially formed on the first flexible substrate 106. The color filter layer 208 and the overcoat 210 are sequentially formed on the second flexible substrate 206. The fill 150 is formed between the first flexible substrate 106 and the second flexible substrate 206. The dam 230 is formed between the first flexible substrate 106 and the second flexible substrate 206 and the fill 150 is surrounded by the dam 230.

Furthermore, when the step of FIG. 1K is performed, the flexible display 100 further comprises the function layer 240 formed on the second flexible substrate 206.

Note that in the first embodiment, the first rigid carrier substrate 102 having the thin film transistor layer 108 and the second rigid carrier substrate 202 having the color filter layer 208 are firstly formed, and then the first rigid carrier substrate 102 and second rigid carrier substrate 202 are assembled, and then the first rigid carrier substrate 102 and second rigid carrier substrate 202 are sequentially removed. Thus, in the first embodiment, the surface processing method is performed to the flexible display 100, and the flexible display 100 is removed from two rigid carrier substrates. Additionally, the flexible display 100 has s moisture and oxygen blocking function by forming the overcoat 210.

Figure 2A:
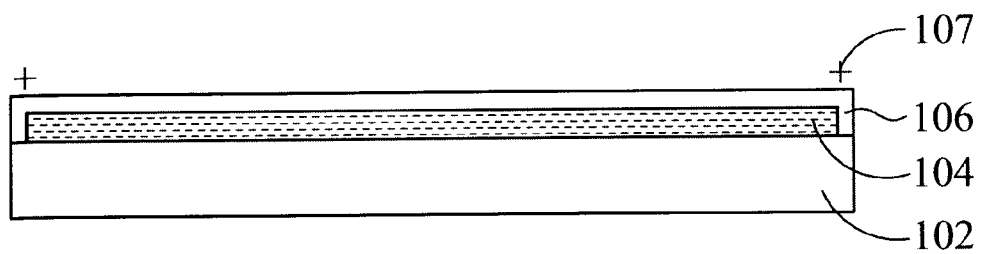
FIGS. 2A-2N show cross-sectional representations of various stages of fabricating a flexible display in accordance with a second embodiment of the disclosure.
Figure 2B:
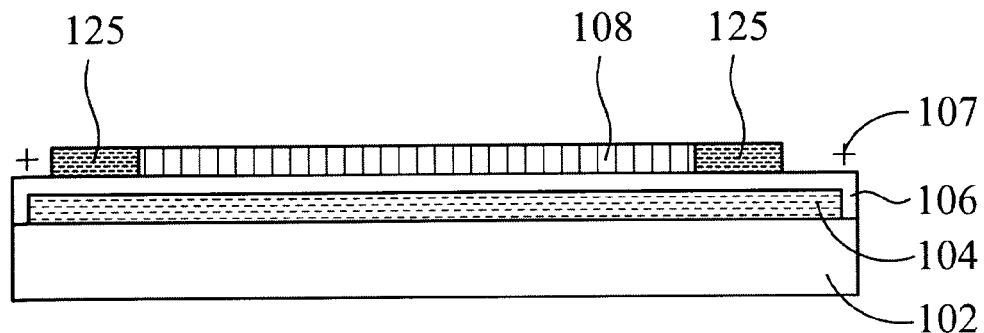
FIGS. 2'A-2'Q show cross-sectional representations of various stages of fabricating a flexible display in accordance with a third embodiment of the disclosure.
Figure 2C:
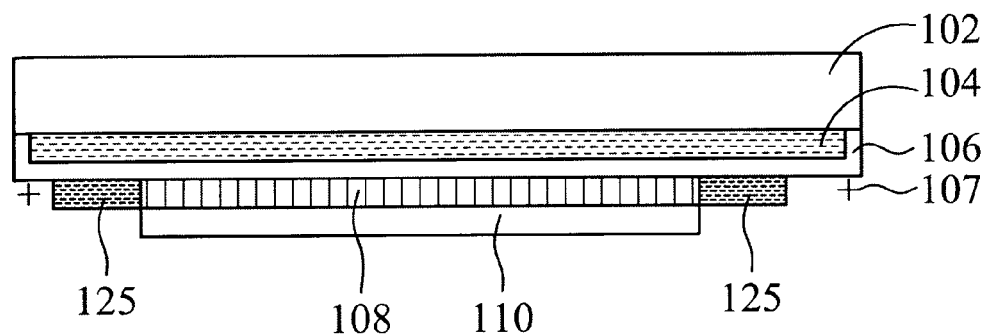
Figure 2D:
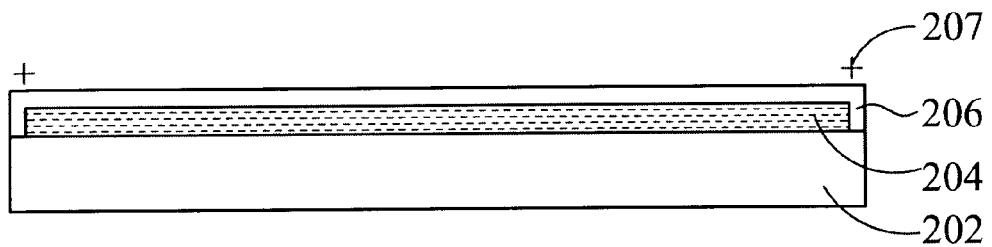
Figure 2E:
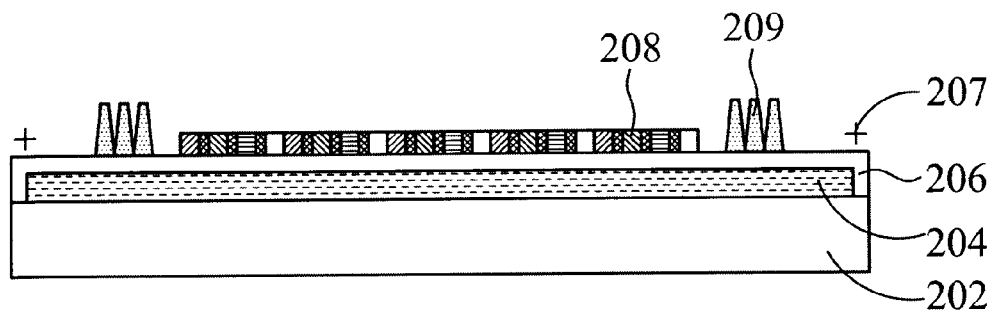
Figure 2F:
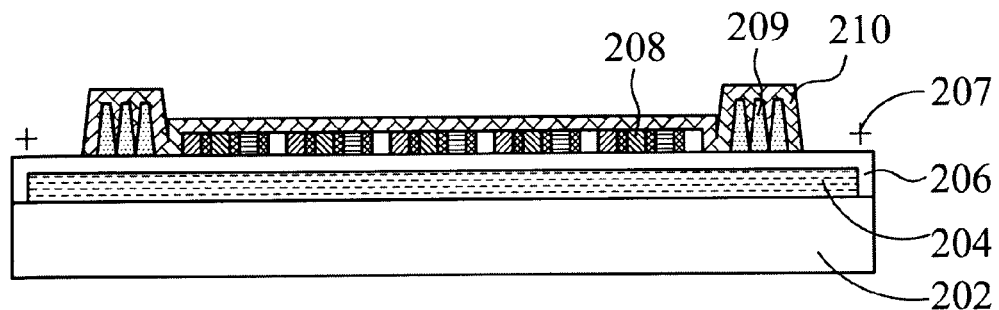
Figure 2G:
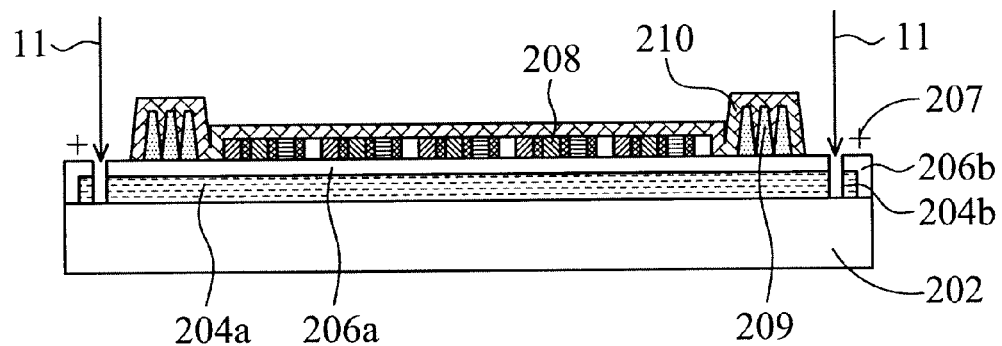
Figure 2H:
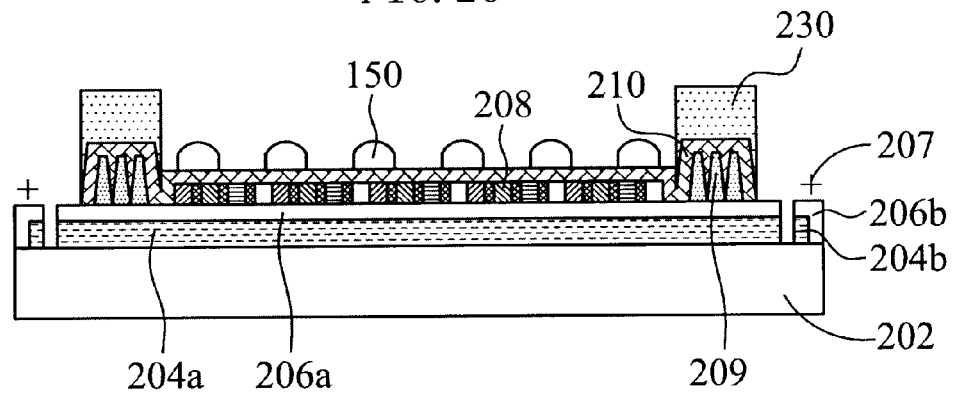
Figure 2I:
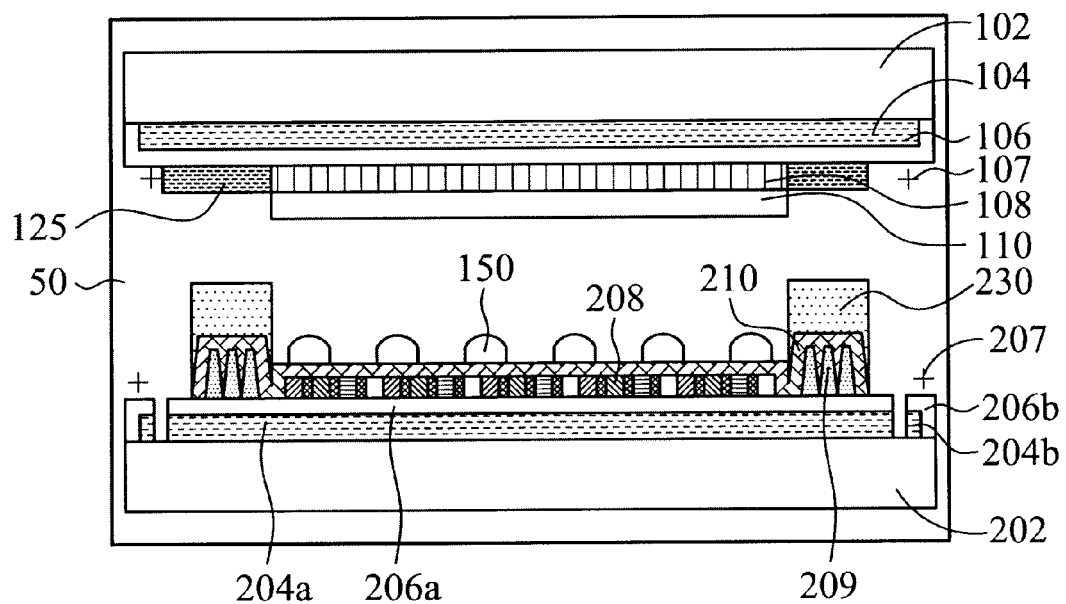
Figure 2J:
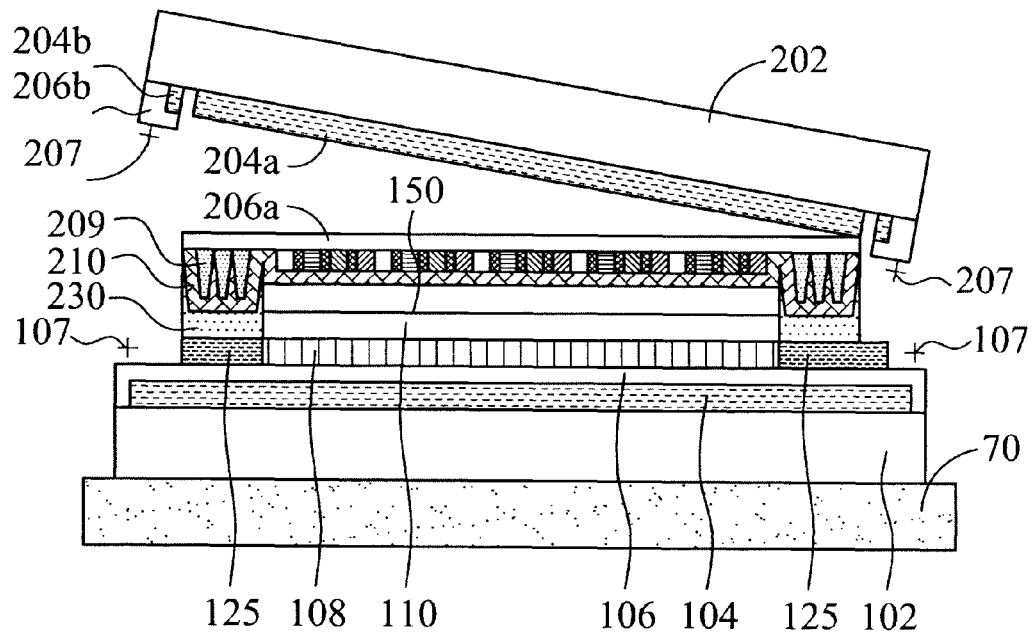
Figure 2K:
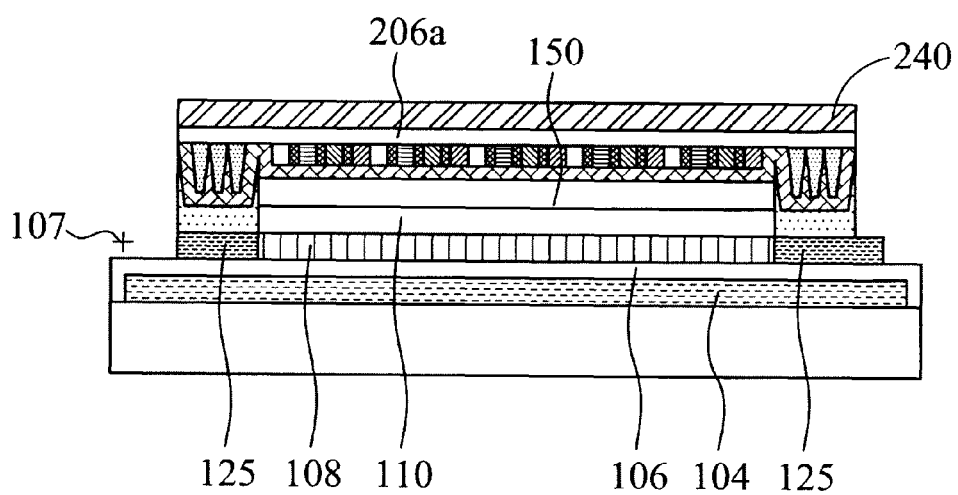
Figure 2L:
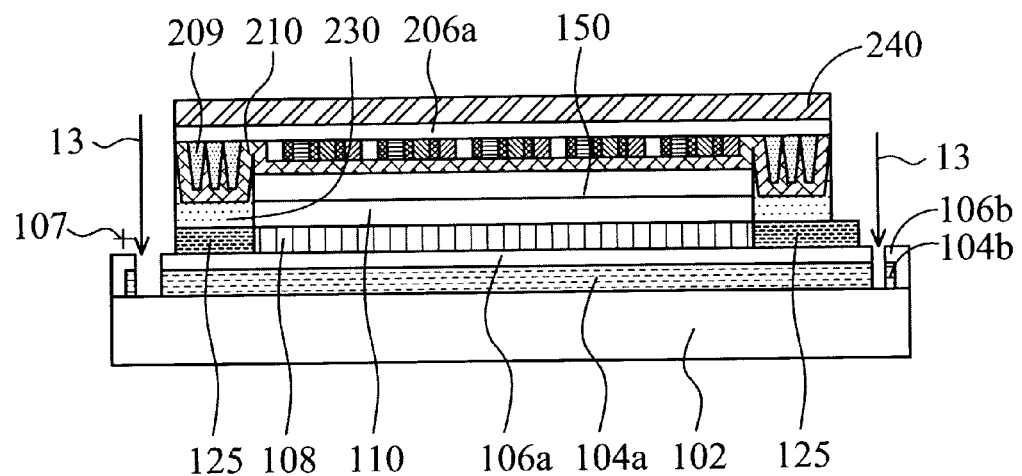
Figure 2M:
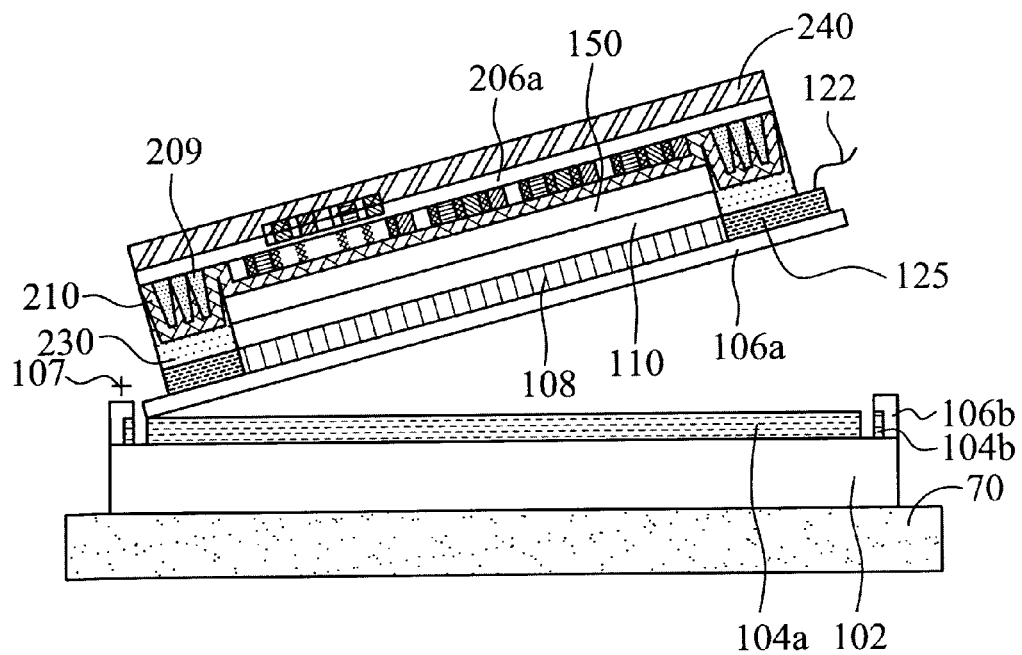
Figure 2N:
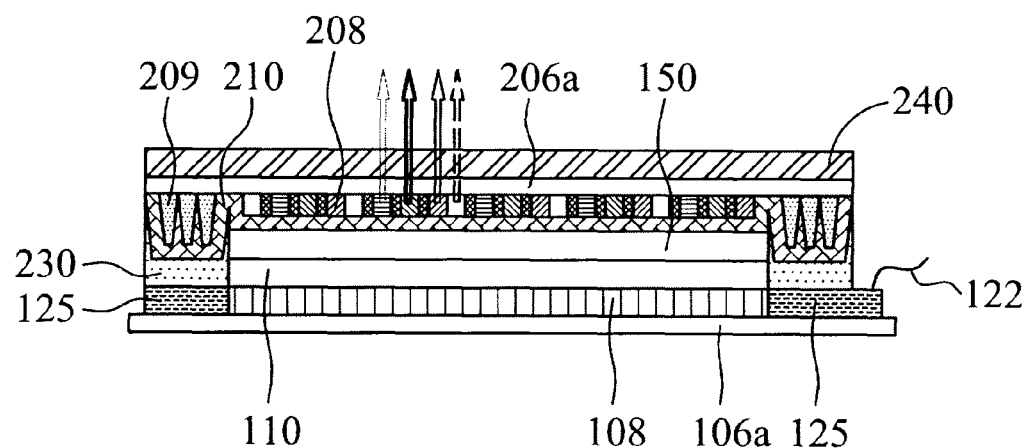
Figure 2N:
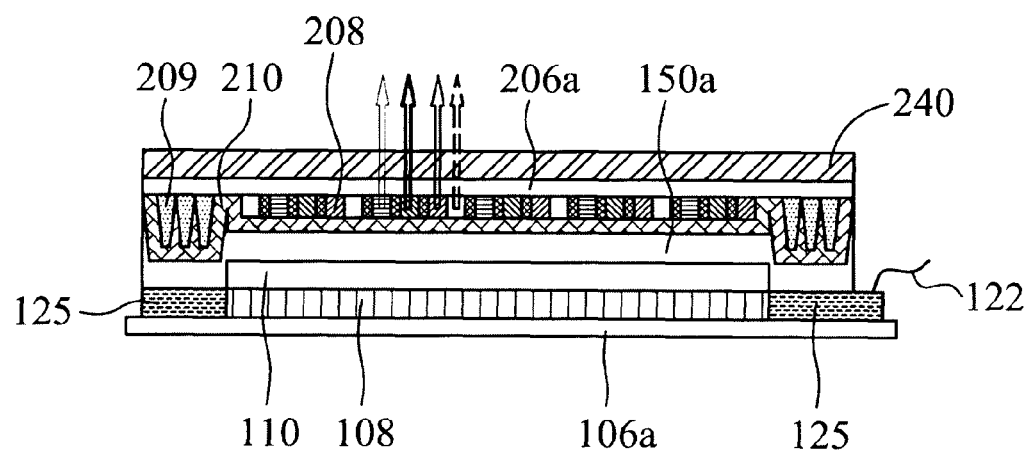

FIGS. 2A-2N show cross-sectional schematic representations of various stages of fabricating a flexible display in accordance with a second embodiment of the disclosure, wherein like elements are identified by the same reference numbers as in the first embodiment, and thus omitted for brevity.

FIG. 2A-2D is like FIG. 1A-1D, and thus omitted for brevity.

Referring to FIG. 2E, before forming the overcoat 210, the sidewall barrier layer (SWB layer) 209 is formed on an edge of the second flexible substrate 206, wherein the color filter layer 208 is surrounded by the sidewall barrier layer (SWB layer) 209.

Note that a height of the sidewall barrier layer (SWB layer) 209 is higher than that of the color filter layer 208 to prevent the fill 150 (shown in FIG. 2I) from overflowing. The material of the sidewall barrier layer (SWB layer) 209 is organic polymer, such as a positive photo resist or negative photo resist or a mixture of organic materials and inorganic materials (e.g. photosensitive polyimide or the like).

It is optional to perform the step of FIG. 2F, wherein the sidewall barrier layer (SWB layer) 209 and the color filter layer 208 are covered by the overcoat 210.

Referring to FIG. 2G, a first cutting step 11 is performed to cut the second de-bonding area 204 and the second flexible substrate 206, wherein the second de-bonding area 204 is divided into a first portion 204a and a second portion 204b, and the second flexible substrate 206 is divided into a first portion 206a and a second portion 206b. The color filter layer 208 is formed between the first portion 204a of the second de-bonding area 204 and the first portion 206a of the second flexible substrate 206.

The first cutting step 11 comprises cutting the second de-bonding areas 204 and the second flexible substrate 206 by a laser beam or a knife wheel.

The step of FIG. 2H may be optionally performed, wherein the dam 230 is formed on an edge of the overcoat 210 and on the sidewall barrier layer (SWB layer) 209, and the color filter layer 208 is surrounded by the dam 230. A height of the dam 230 is higher than that of the color filter layer 208 to prevent the fill 150 (shown in FIG. 2I) form overflowing. In other embodiment, the height of the dam 230 is equal to that of the color filter layer 208 to prevent the fill 150 (shown in FIG. 2I) form overflowing.

Referring to FIG. 2I, the first rigid carrier substrate 102 and the second rigid carrier substrate 202 are assembled. The assembly of the first rigid carrier substrate 102 and the second rigid carrier substrate 202 are aligned by first alignment mark 107 and second alignment mark 207. The fill 150 is formed between the first portion 206a of the second flexible substrate 206 and the first flexible substrate 106. The assembling method is the same as the first embodiment, and thus is omitted for brevity.

Referring to FIG. 2N', in another embodiment, another kind of fill (such as sheet type comprehensive glue 150a) is formed between the first portion 206a of the second flexible substrate 206 and the third portion 106a of the first flexible substrate 106 when the dam 230 is not formed. The sheet type comprehensive glue 150a is degassed under a low pressure and is heated to assemble the first portion 206a of the second flexible substrate 206 and the third portion 106a of the first flexible substrate 106.

Referring to FIG. 2J, the first rigid carrier substrate 102 is fixed by the immobile device 70, and the immobile device 70 is fixed by a vacuum method, a fixture or an electrostatic chucking method, the second de-bonding area 204 is separated from the first portion 206a of the second flexible substrate 206 to expose a surface of the first portion 206a of the second flexible substrate 206, and the second rigid carrier substrate 202 and the second de-bonding area 204 are removed.

Before performing the step of FIG. 2L, the step of FIG. 2K may be optionally performed, wherein after separating the second de-bonding area 204 from the first portion 206a of the second flexible substrate 206, a surface processing method is performed to a surface of the first portion 206a of the second flexible substrate 206.

The surface processing method comprises adhering the function layer 240 on the exposed surface of the first portion 206a of the second flexible substrate 206. The numbers and the materials of the function layer 240 may be adjusted according to the actual application for those skilled in the art.

Referring to FIG. 2L, a second cutting step 13 is performed to cut the first de-bonding area 104 and the first flexible substrate 106, wherein the first de-bonding area 104 is divided into a third portion 104a and a fourth portion 104b, and the first flexible substrate 106 is divided into a third portion 106a and a fourth portion 106b, wherein the thin film transistor layer 108 is formed on the third portion 106a of the first flexible substrate 106.

Additionally, the conductive line 125 is exposed outside of dam 230, conductive line 125 is electrically connected to a flexible printed circuit (FPC) 122 bonding.

The second cutting step 13 comprises cutting the first de-bonding area 104 and the first flexible substrate 106 by a laser beam or a knife wheel.

Referring to FIG. 2M, the first de-bonding area 104 is separated from the third portion 106a of the first flexible substrate 106, and the first rigid carrier substrate 102 and the first de-bonding area 104 are removed to form the flexible display 200.

FIG. 2N shows a cross-sectional schematic representation of a top emission flexible display 100. The difference between FIG. 1N and FIG. 2N is that the additional sidewall barrier layer (SWB layer) 209 is formed in FIG. 2N. The sidewall barrier layer (SWB layer) 209 prevents the fill 150 (shown in FIG. 2I) from overflowing and has the moisture and oxygen blocking function.

The disclosure also provided another method for fabricating flexible displays. FIGS. 2'A-2'Q show cross-sectional schematic representations of various stages of fabricating a flexible display in accordance with a third embodiment of the disclosure, wherein like elements are identified by the same reference numbers as in the first embodiment, and thus omitted for brevity.

FIG. 2'A-2'D is like FIG. 2A-2D, and thus omitted for brevity.

Referring to FIG. 2'E, a touch unit 220 is formed on the second flexible substrate 206, and a touch unit conductive line 225 is adjacent to the touch unit 220 and formed on an edge of the second flexible substrate 206.

Referring to FIG. 2'F, a color filter layer 208 is formed on the touch unit 220. In another embodiment, the color filter layer 208 may be formed below the touch unit 220. The position of the color filter layer 208 may be adjusted according to the actual application.

Referring to FIG. 2'G, before forming the overcoat 210, the sidewall barrier layer (SWB layer) 209 is formed on an edge of the second flexible substrate 206 and on the touch unit conductive line 225, wherein the color filter layer 208 is surrounded by the sidewall barrier layer (SWB layer) 209.

Note that a height of the sidewall barrier layer (SWB layer) 209 is higher than that of the color filter layer 208 to prevent the fill 150 (shown in FIG. 2'K) from overflowing. The material of the sidewall barrier layer (SWB layer) 209 is organic polymer, such as a positive photo resist or negative photo resist or a mixture of organic materials and inorganic materials (e.g. photosensitive polyimide or the like).

It is optional to perform the step of FIG. 2'H, wherein the sidewall barrier layer (SWB layer) 209 and the color filter layer 208 are covered by the overcoat 210. The overcoat 210 is an inorganic film having a moisture blocking function, such as silicon nitride, silicon oxide, alumina oxide or a combination of organic materials and inorganic materials. The function of the overcoat 210 is to reduce the long-time damage caused by solvents and small molecules from the color filter layer 208. The overcoat 210 is formed by chemical vapor deposition (CVD), sputter, atomic layer deposition (ALD), spin coating or dipping.

Referring to FIG. 2'I, a first cutting step 11 is performed to cut the second de-bonding area 204 and the second flexible substrate 206, and the second de-bonding area 204 is divided into a first portion 204a and a second portion 204b, and the second flexible substrate 206 is divided into a first portion 206a and a second portion 206b. The color filter layer 208 is formed on the first portion 204a of the second de-bonding area 204 and on the first portion 206a of the second flexible substrate 206.

Note that in FIG. 2'I, the second alignment mark 207 is formed outside of the cutting line (see reference number 11). In other embodiment, the second alignment mark 207 is formed inside of the cutting line (see reference number 11).

The first cutting step 11 comprises cutting the second de-bonding areas 204 and the second flexible substrate 206 by irradiating a laser beam or a knife wheel.

In one embodiment, a carbon dioxide ($CO_2$) laser is used. The wavelength of the laser is about 10640 nm, the power of the laser is smaller than 50 Watt, and the rate of the laser is about 10 mm/s-60 mm/s.

In another embodiment, an IR laser is used. The wavelength of the IR laser is about 810 nm, the power of the laser is about 0.9-10 Watt, and the rate of the laser is about 0.2 mm/s-15 mm/s.

Referring to FIG. 2'J, a dam 230 is formed on the first portion 206a of the second flexible substrate 206, wherein the color filter layer 208 and the light emitting unit 110 are surrounded by the dam 230 and a fill 150 is located inside of the dam 230.

The material of dam 230 is an organic material or a combination of organic materials and inorganic materials, such as epoxy, a mixture of epoxy and inorganic materials.

Referring to FIG. 2'J again, a conductive pillar 235 is formed on the touch unit conductive line 225. The materials of conductive pillar 235 are including metal wire, anisotropic conductive film, conductive paste or the like. The conductive pillar 235 is used to electrically connect to the conductive line 125.

Referring to FIG. 2'K, The first rigid carrier substrate 102 and the second rigid carrier substrate 202 are assembled by the following steps. The first rigid carrier substrate 102 and the second rigid carrier substrate 202 are put in a vacuum chamber 50. The assembly of the first rigid carrier substrate 102 and the second rigid carrier substrate 202 are aligned by first alignment mark 107 and second alignment mark 207. The fill 150 is filled between the first portion 206a of the second flexible substrate 206 and the first flexible substrate 106. The assembling method is the same as the first embodiment, and thus is omitted for brevity.

Referring to FIG. 2'L, the first rigid carrier substrate 102 and the second rigid carrier substrate 202 are assembled.

Referring to FIG. 2'M the first rigid carrier substrate 102 is fixed, the second de-bonding area 204 is separated from the first portion 206a of the second flexible substrate 206 to expose a surface of the first portion 206a of the second flexible substrate 206, and the second rigid carrier substrate 202 and the second de-bonding area 204 are removed.

In one embodiment, the first rigid carrier substrate 102 is fixed by an immobile device 70, and the immobile device 70 is fixed by a vacuum method, a fixture or an electrostatic chucking method.

Referring to FIG. 2'N, after separating the second de-bonding area 204 from the first portion 206a of the second flexible substrate 206, a surface processing method is performed to a surface of the first portion 206a of the second flexible substrate 206.

The surface processing method comprises adhering a function layer 240 to the exposed surface of the first portion 206a of the second flexible substrate 206. The function layer 240 comprises barrier layers, polarizer films, anti reflectance coating layers, anti-scratch protective films, or touch panels or the like. The numbers of the function layer 240 is not limited to two layers. The numbers of the function layer 240 may be adjusted according to the actual application for those skilled in the art.

Referring to FIG. 2'O, a second cutting step 13 is performed to cut the first de-bonding area 104 and the first flexible substrate 106, wherein the first de-bonding area 104 is divided into a third portion 104a and a fourth portion 104b, and the first flexible substrate 106 is divided into a third portion 106a and a fourth portion 106b, and wherein the thin film transistor layer 108 is formed on the third portion 106a of the first flexible substrate 106.

Additionally, the conductive line 125 is exposed outside of dam 230, conductive line 125 is electrically connected to a flexible printed circuit (FPC) 122 bonding.

The second cutting step 13 comprises cutting the first de-bonding area 104 and the first flexible substrate 106 by a laser beam or a knife wheel.

Referring to FIG. 2'P, the first de-bonding area 104 is separated from the third portion 106a of the first flexible substrate 106, and the first rigid carrier substrate 102 and the first de-bonding area 104 are removed to form the flexible display 200'.

FIG. 2'Q shows a cross-sectional schematic representation of a top emission flexible display 200'. The flexible display 200' comprises the first flexible substrate 106 (106a) and the second flexible substrate 206 (206a), and wherein the first flexible substrate 106 (106a) is disposed oppositely to the second flexible substrate 206 (206a). The thin film transistor layer 108 and the light emitting unit 110 are sequentially formed on the first flexible substrate 106. The touch unit 220, the color filter layer 208 and the overcoat 210 are sequentially formed on the second flexible substrate 206. The fill 150 is formed between the color filter layer 208 and the light emitting unit 110. The dam 230 is formed between the first flexible substrate 106 and the second flexible substrate 206 and the fill 150 is surrounded by the dam 230.

The disclosure also provided another method for fabricating flexible displays. FIG. 3A-3L show cross-sectional schematic representations of various stages of fabricating a flexible display in accordance with a fourth embodiment of the disclosure, wherein like elements are identified by the same reference numbers as in the first embodiment, and thus omitted for brevity. Note that in the third embodiment, a color filter on array (COA) 208' structure including the thin film transistor layer and the color filter layer is formed on the first rigid carrier substrate 102.

Figure 3A:
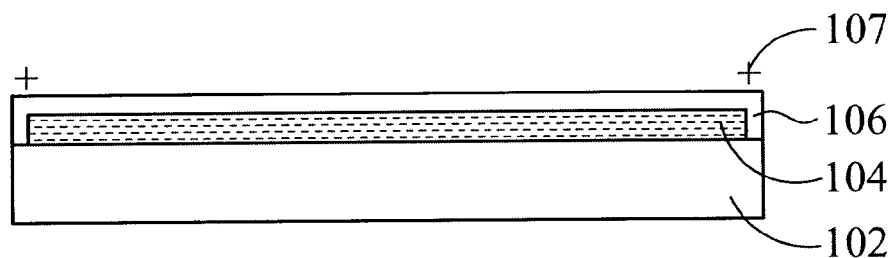
FIGS. 3A-3L show cross-sectional representations of various stages of fabricating a flexible display in accordance with a fourth embodiment of the disclosure.

FIG. 3A is like FIG. 1A, and thus omitted for brevity.

Figure 3B:
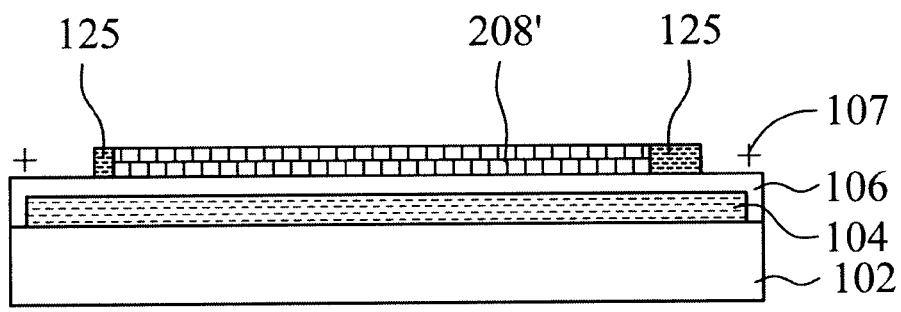

Referring to FIG. 3B, color filter on array (COA) 208' is formed on the first flexible substrate 106.

Figure 3C:
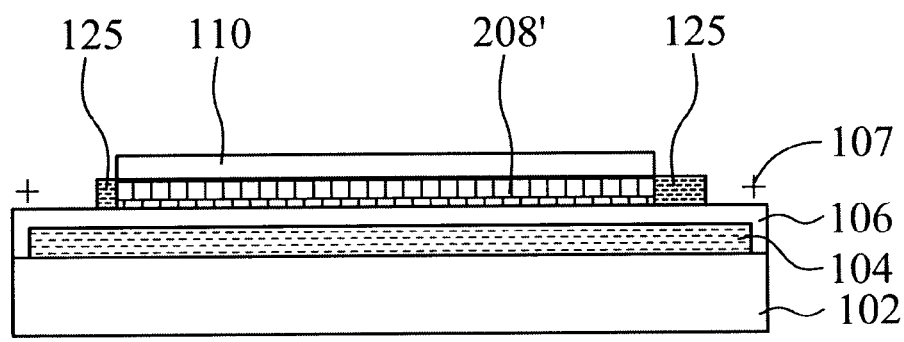

Referring to FIG. 3C, the light emitting unit 110 is formed on color filter on array (COA) 208'.

Figure 3D:
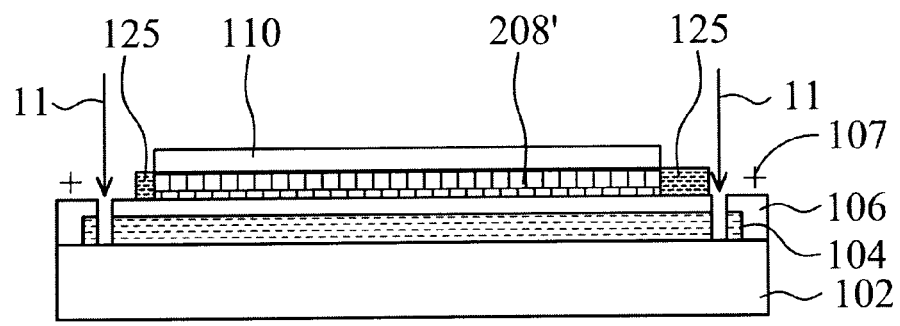

Referring to FIG. 3D, a first cutting step 11 is performed to cut the first de-bonding areas 104 and the first flexible substrate 106. The first de-bonding areas 104 are divided into a first portion 104a and a second portion 104b, and the first flexible substrate 106 is divided into a first portion 106a and a second portion 106b.

Figure 3E:
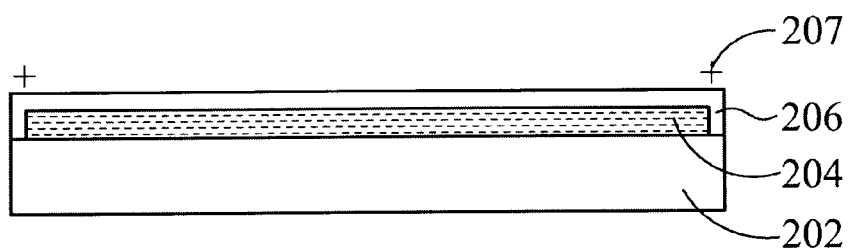

FIG. 3E is like FIG. 1D, and thus omitted for brevity.

Figure 3F:
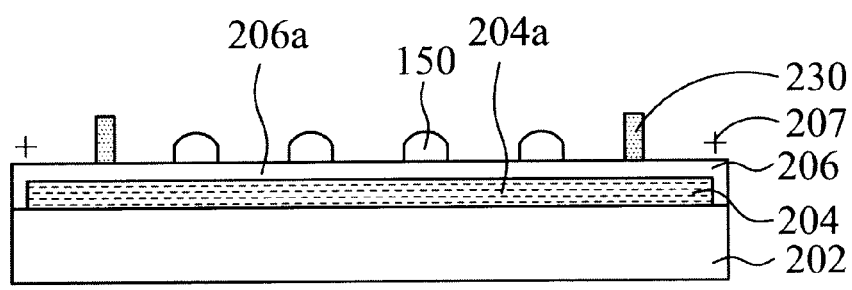

The step of FIG. 3F may be optionally performed, wherein the dam 230 is formed on an edge of the second flexible substrate 206. The material of the dam 230 of the third embodiment is the same as that of the first embodiment, and thus is omitted for brevity. After forming the dam 230, the fill 150 is formed on the second flexible substrate 206.

Figure 3G:
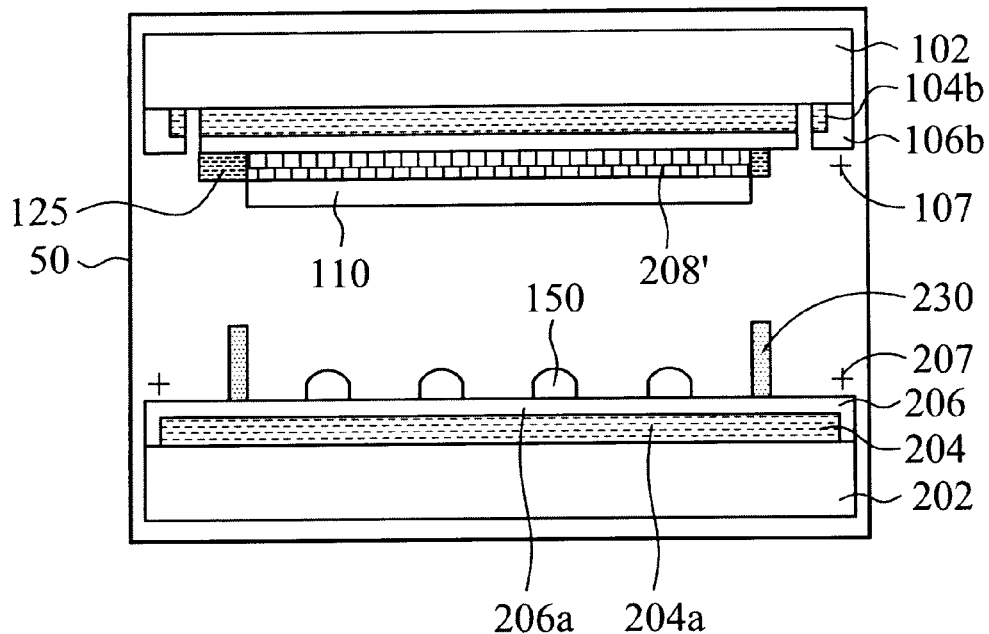

Referring to FIG. 3G, the first rigid carrier substrate 102 and the second rigid carrier substrate 202 are assembled. The assembly of the first rigid carrier substrate 102 and the second rigid carrier substrate 202 are aligned by first alignment mark 107 and second alignment mark 207. The fill 150 is formed between the first rigid carrier substrate 102 and the second rigid carrier substrate 202. The glue 150a is formed between the light emitting unit 110 and the second flexible substrate 206 (206a).

Figure 3H:
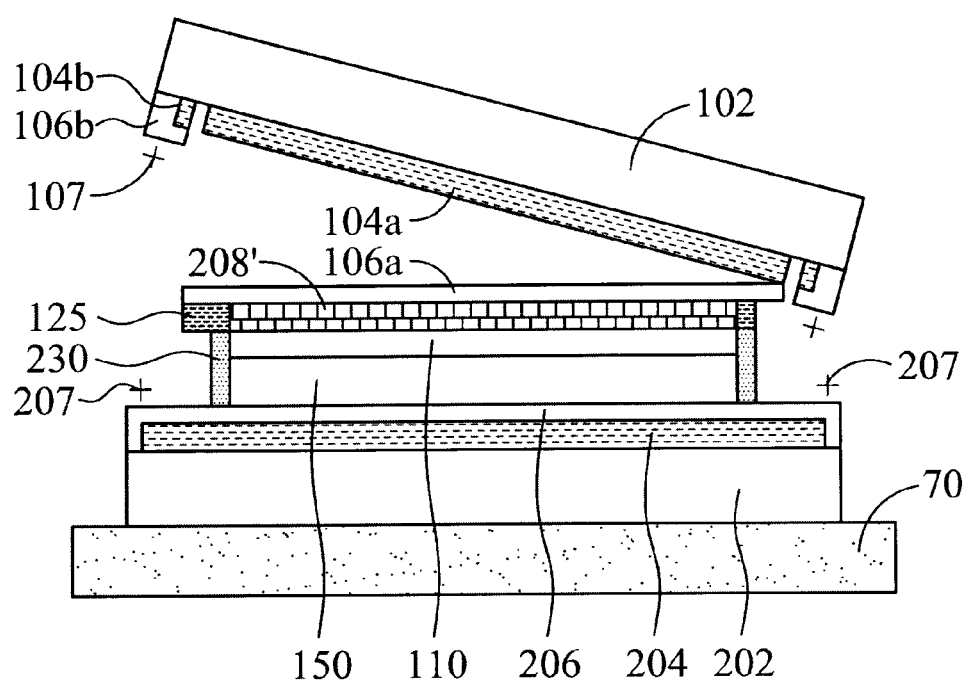
Figure 3I:
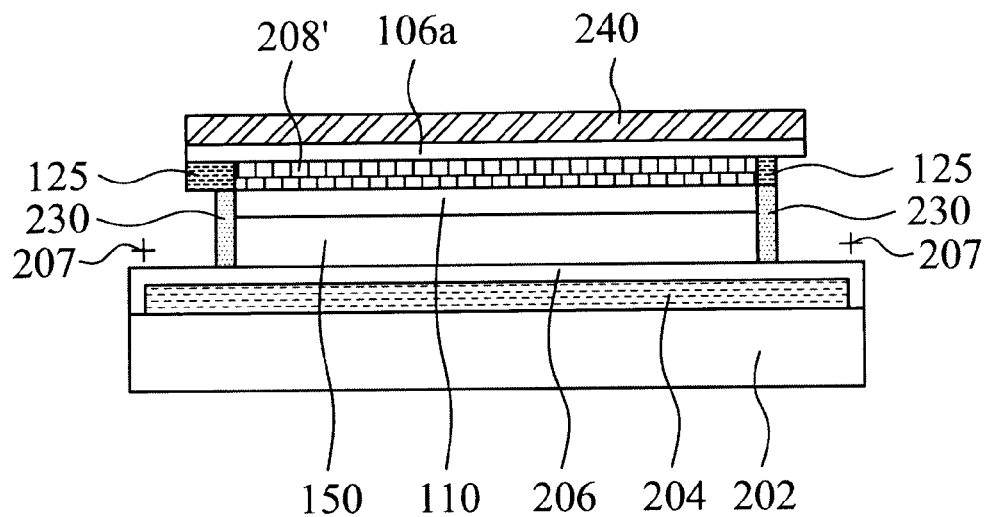
Figure 3J:
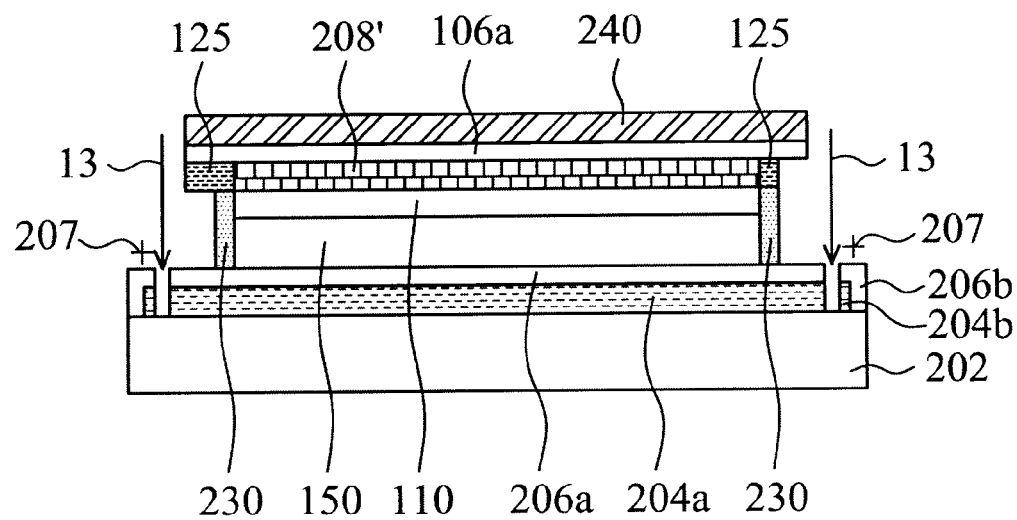
Figure 3K:
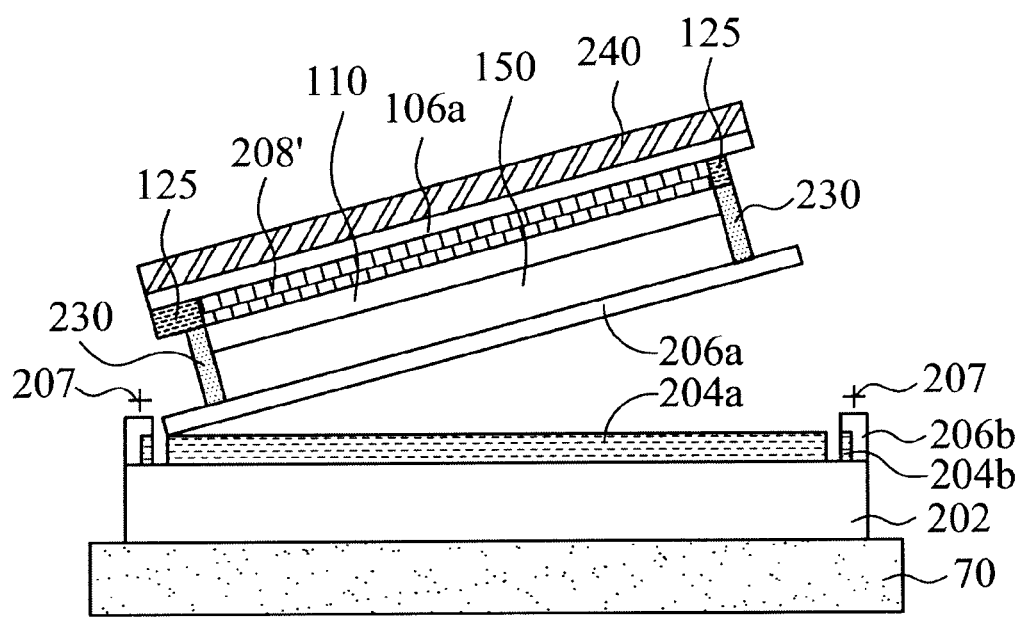
Figure 3L:
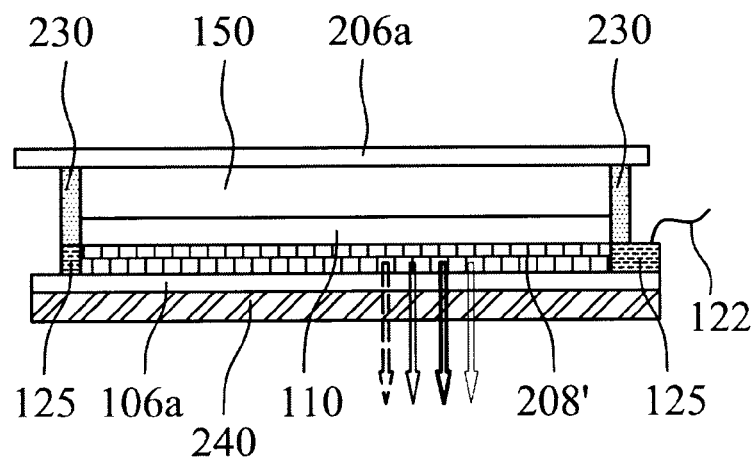
Figure 3L:
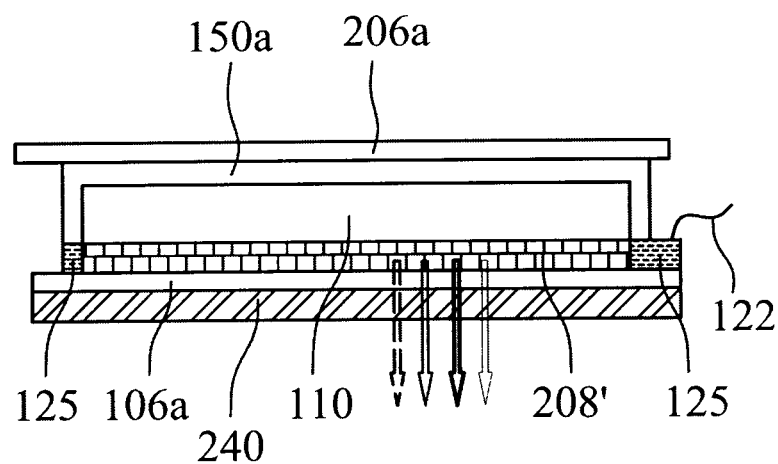

Referring to FIG. 3L', in another embodiment, another kind of fill (such as sheet type comprehensive glue 150a) is formed between the first rigid carrier substrate 102 and the second rigid carrier substrate 202 when the dam 230 is not formed. The sheet type comprehensive glue 150a is degassed under a low pressure and is heated to assemble the first rigid carrier substrate 102 and the second rigid carrier substrate 202.

Referring to FIG. 3H, the second rigid carrier substrate 202 is fixed by the immobile device 70, and the immobile device 70 is fixed by a vacuum method, a fixture or an electrostatic chucking method, the first de-bonding area 104 is separated from the first portion 106a of the first flexible substrate 106 to expose a surface of the first portion 106a of the first flexible substrate 106, and the first rigid carrier substrate 102 is removed.

Before performing the step of FIG. 3J, the step of FIG. 3I may be optionally performed, wherein after separating the first de-bonding area 104 from the first portion 106a of the first flexible substrate 106, a surface processing method is performed to a surface of the first portion 106a of the first flexible substrate 106.

The surface processing method comprises adhering a function layer 240 on the exposed surface of the first portion 106a of the first flexible substrate 106. The numbers and the materials of the function layer 240 may be adjusted according to the actual application for those skilled in the art.

Referring to FIG. 3J, a second cutting step 13 is performed to cut the second de-bonding area 204 and the second flexible substrate 206, wherein the second flexible substrate 206 is divided into a third portion 206a and a fourth portion 206b.

Additionally, the conductive line 125 is exposed outside of dam 230, conductive line 125 is electrically connected to a flexible printed circuit (FPC) 122 bonding.

Referring to FIG. 3K, the second de-bonding area 204 is separated from the third portion 206a of the second flexible substrate 206, and the second rigid carrier substrate 202 and the second de-bonding area 204 are removed to form the flexible display 300.

FIG. 3L shows a cross-sectional schematic representation of a bottom emission flexible display 300. The difference between FIG. 3L and FIG. 1N is bottom emission type display by using color filter on array (COA) 208' structure in FIG. 3L.

The flexible display 300 comprises the first flexible substrate 106 (106a) and oppositely disposed second flexible substrate 206 (206a). The color filter on array (COA) 208' structure and the light emitting unit 110 are sequentially formed on the first flexible substrate 102. The fill 150 formed between the light emitting unit 110 and the second flexible substrate 206. The dam 230 formed between the first flexible substrate 106 and the second flexible substrate 206 and surrounding the fill 150.

The disclosure also provided another method for fabricating flexible displays. FIGS. 4A-4L show cross-sectional schematic representations of various stages of fabricating a flexible display in accordance with a fifth embodiment of the disclosure, wherein like elements are identified by the same reference numbers as in the first embodiment, and thus omitted for brevity. Note that in the fourth embodiment, a color filter on array (COA) 208' is formed on the first flexible substrate 106.

Figure 4A:
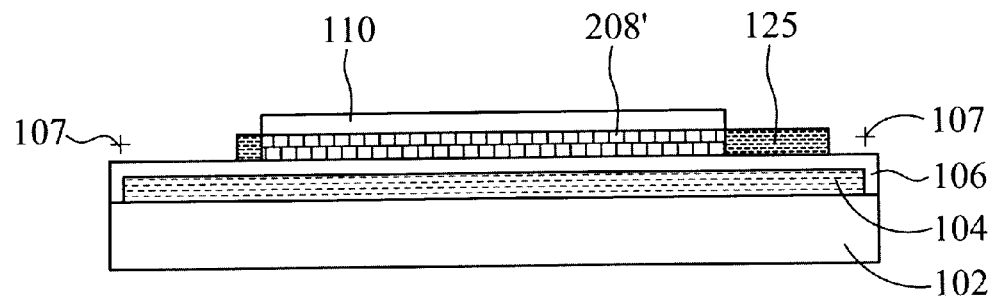
FIGS. 4A-4K show cross-sectional schematic representations of various stages of fabricating a flexible display in accordance with a fifth embodiment of the disclosure.

Referring to FIG. 4A, the color filter on array (COA) 208', the light emitting unit 110 are sequentially formed on the first flexible substrate 106.

Figure 4B:
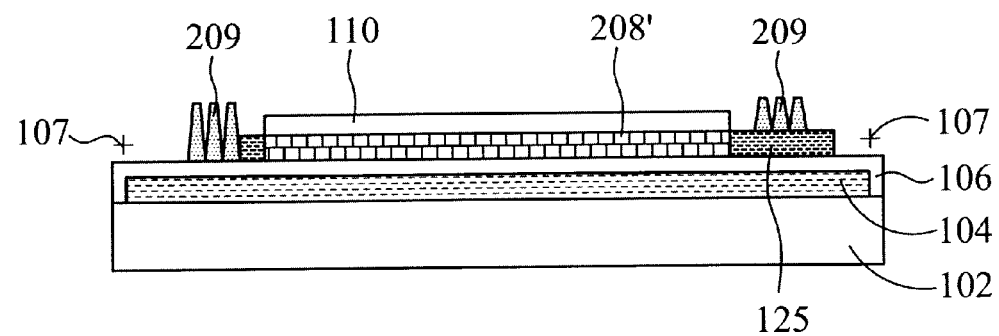

Referring to FIG. 4B, the sidewall barrier layer (SWB layer) 209 is formed on the first flexible substrate 106 and the color filter on array (COA) 208', the light emitting unit 110 is surrounded by the sidewall barrier layer (SWB layer) 209.

Figure 4C:
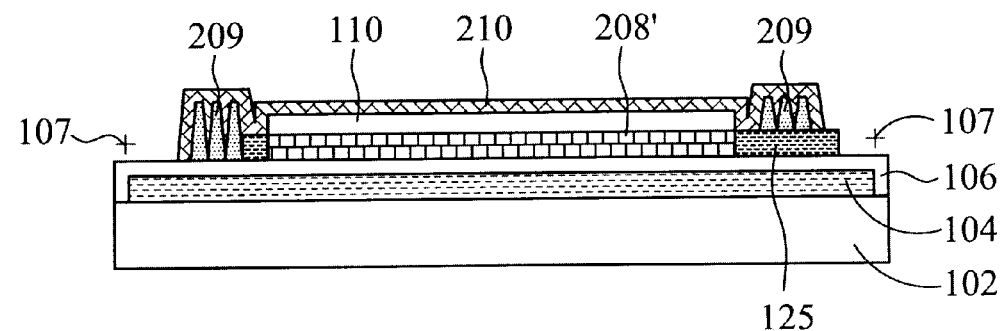

Referring to FIG. 4C, the overcoat 210 is formed to cover the sidewall barrier layer (SWB layer) 209 and the light emitting unit 110.

Figure 4D:
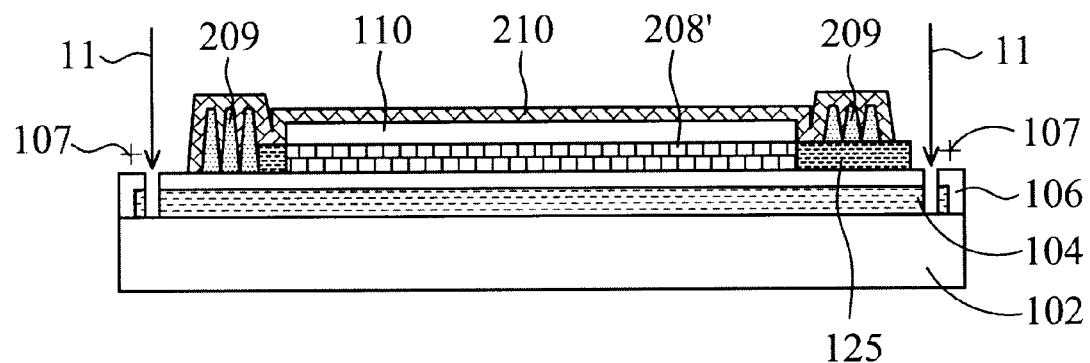

Referring to FIG. 4D, a first cutting step 11 is performed to cut the first de-bonding areas 104 and the first flexible substrate 106. The first de-bonding areas 104 are divided into a first portion 104a and a second portion 104b, and the first flexible substrate 106 is divided into a first portion 106a and a second portion 106b.

Figure 4E:
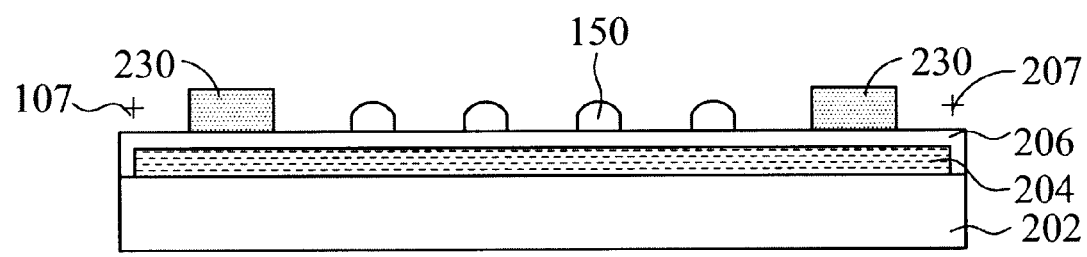

Referring to FIG. 4E, a second rigid carrier substrate 202 is provided, wherein a second de-bonding area 204 and a second flexible substrate 206 are sequentially formed on the second rigid carrier substrate 202, and an area of the second de-bonding area 204 is smaller than or equal to an area of the second flexible substrate 206. The material of the second rigid carrier substrate 202 is like that of the first rigid carrier substrate 102, and the material of the second flexible substrate 206 is like that of the first flexible substrate 106, and thus omitted for brevity. Additionally, the second alignment mark 207 is formed on the second flexible substrate 206. A dam 230 is formed on an edge of the second flexible substrate 206. The material of the dam 230 is the same as that of the first embodiment, and thus is omitted for brevity.

Figure 4F:
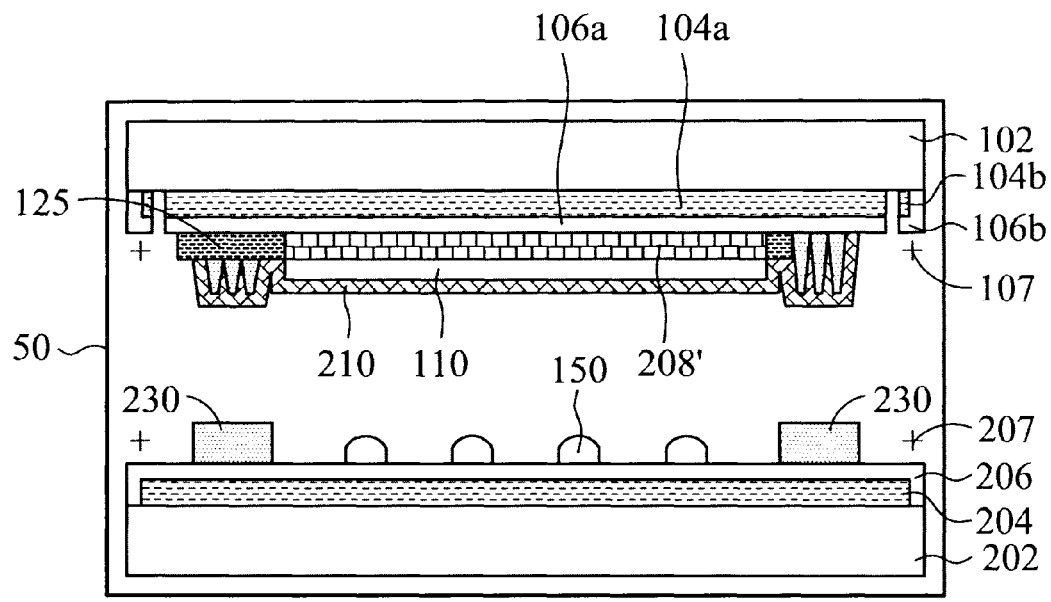

Referring to FIG. 4F, the first rigid carrier substrate 102 and the second rigid carrier substrate 202 are assembled. The assembly of the first rigid carrier substrate 102 and the second rigid carrier substrate 202 are aligned by first alignment mark 107 and second alignment mark 207. The fill 150 is formed between the first rigid carrier substrate 102 and the second rigid carrier substrate 202. The fill 150 is formed between the light emitting unit 110 and the second flexible substrate 206 (206a).

In another embodiment, another kind of fill (such as sheet type comprehensive glue 150a) is formed between the first rigid carrier substrate 102 and the second rigid carrier substrate 202 when the dam 230 is not formed. The sheet type comprehensive glue 150a is degassed under a low pressure and is heated to assemble the first rigid carrier substrate 102 and the second rigid carrier substrate 202.

Figure 4G:
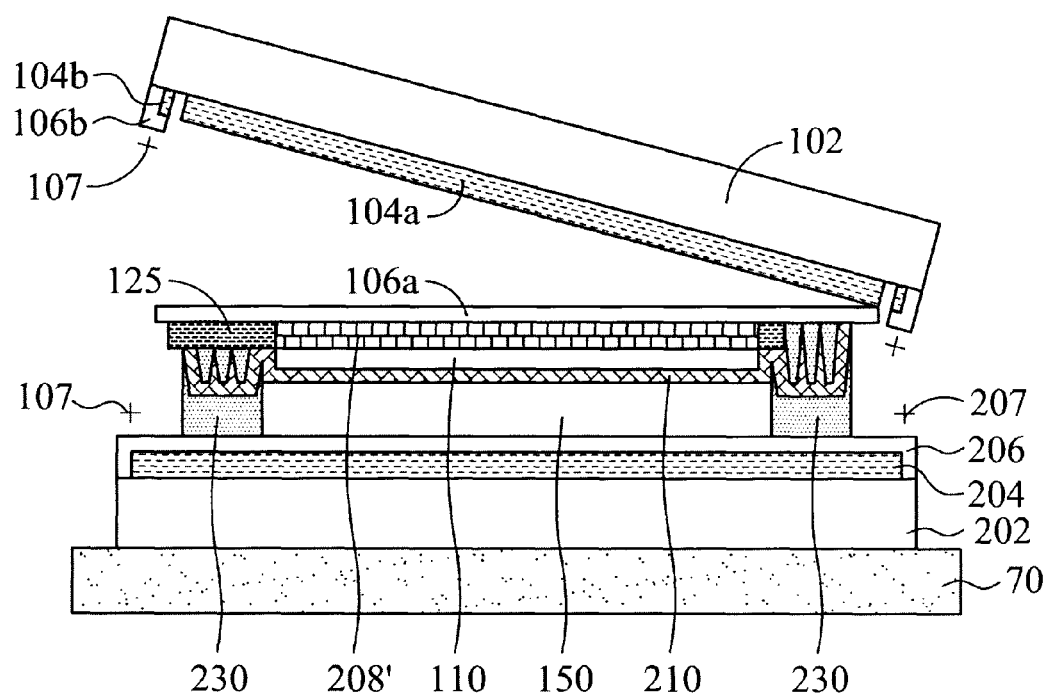

Referring to FIG. 4G, the second rigid carrier substrate 202 is fixed by the immobile device 70, and the immobile device 70 is fixed by a vacuum method, a fixture or an electrostatic chucking method, the first de-bonding area 104 is separated from the first portion 106a of the first flexible substrate 106 to expose a surface of the first portion 106a of the first flexible substrate 106, and the first rigid carrier substrate 102 is removed.

Figure 4H:
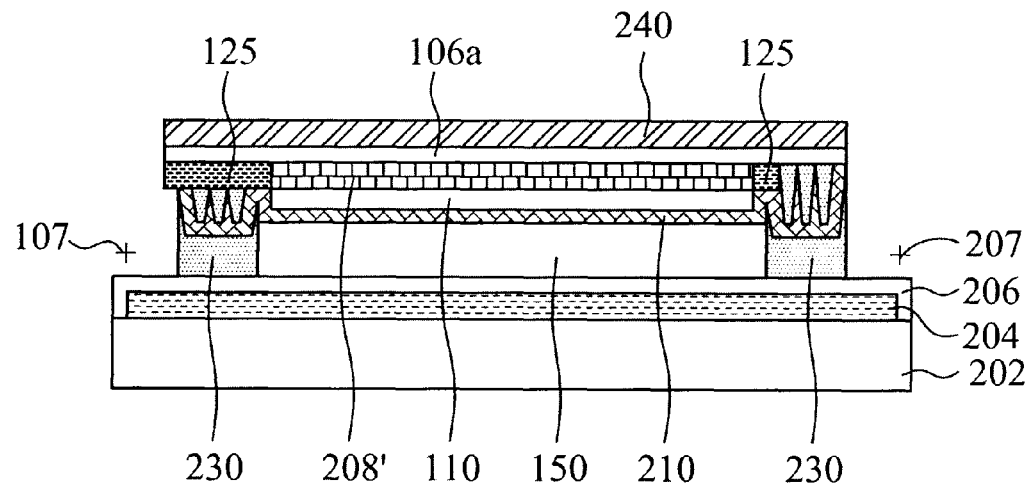
Figure 4I:
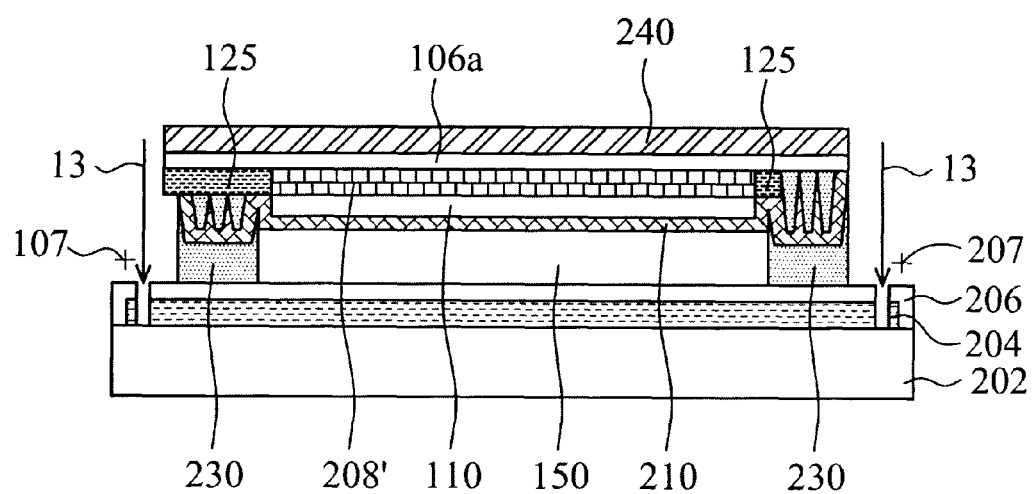

Before performing the step of FIG. 4I, the step of FIG. 4H may be optionally performed, wherein after separating the first de-bonding area 104 from the first portion 106a of the first flexible substrate 106, a surface processing method is performed to a surface of the first portion 106a of the first flexible substrate 106.

The surface processing method comprises adhering a function layer 240 on the exposed surface of the first portion 106a of the first flexible substrate 106. The numbers and the materials of the function layer 240 may be adjusted according to the actual application for those skilled in the art.

Referring to FIG. 4I, a second cutting step 13 is performed to cut the second de-bonding area 204 and the second flexible substrate 206, wherein the second flexible substrate 206 is divided into a third portion 206a and a fourth portion 206b, and wherein the color filter on array (COA) 208' is formed on the third portion 106a of the second flexible substrate 206.

Additionally, the conductive line 125 is exposed outside of dam 230, conductive line 125 is electrically connected to a flexible printed circuit (FPC) 122 bonding.

Figure 4J:
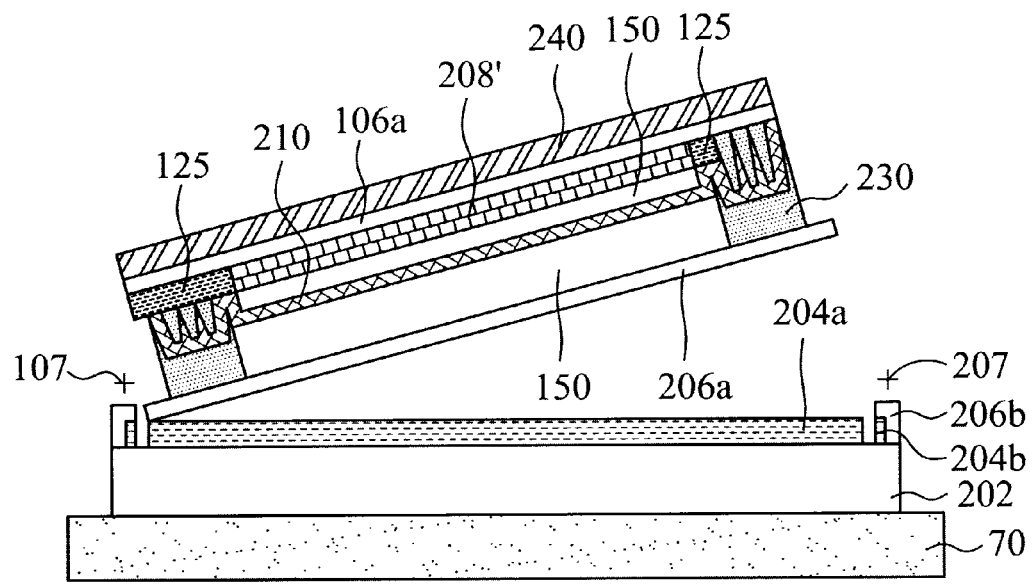

Referring to FIG. 4J, the second de-bonding area 204 is separated from the third portion 206a of the second flexible substrate 206, and the second rigid carrier substrate 202 and the second de-bonding area 204 are removed to form the flexible display 400.

Figure 4K:
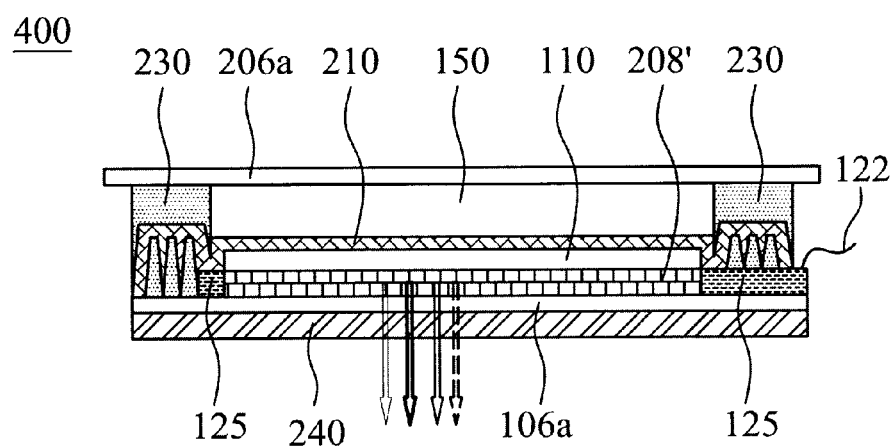

FIG. 4K shows a cross-sectional schematic representation of a bottom emission flexible display 400.

The disclosure also provided another method for fabricating flexible displays. FIGS. 5A-5K show cross-sectional schematic representations of various stages of fabricating a flexible display in accordance with a sixth embodiment of the disclosure, wherein like elements are identified by the same reference numbers as in the first embodiment, and thus omitted for brevity.

Figure 5A:
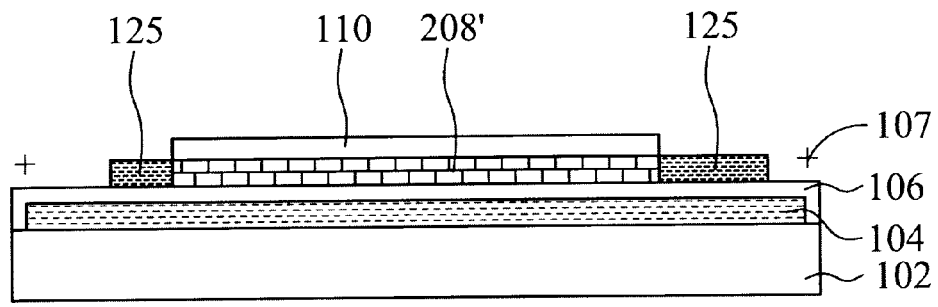
FIGS. 5A-5K show cross-sectional schematic representations of various stages of fabricating a flexible display in accordance with a third embodiment of the disclosure.

Referring to FIG. 5A, the color filter on array (COA) 208' and the light emitting unit 110 are sequentially formed on the first flexible substrate 106.

Figure 5B:
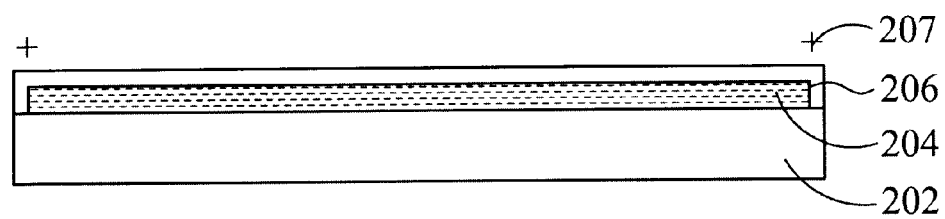

Referring to FIG. 5B, a second rigid substrate 202 is provided, wherein a second de-bonding area 204 and a second flexible substrate 206 are sequentially formed on the second rigid carrier substrate 202, and an area of the second de-bonding area 204 is smaller than or equal to an area of the second flexible substrate 206. The material of the second rigid substrate 202 is like that of the first rigid substrate 102, and the material of the second flexible substrate 206 is like that of the first flexible substrate 106, and thus omitted for brevity. Additionally, the second alignment mark 207 is formed on the second flexible substrate 206.

Figure 5C:
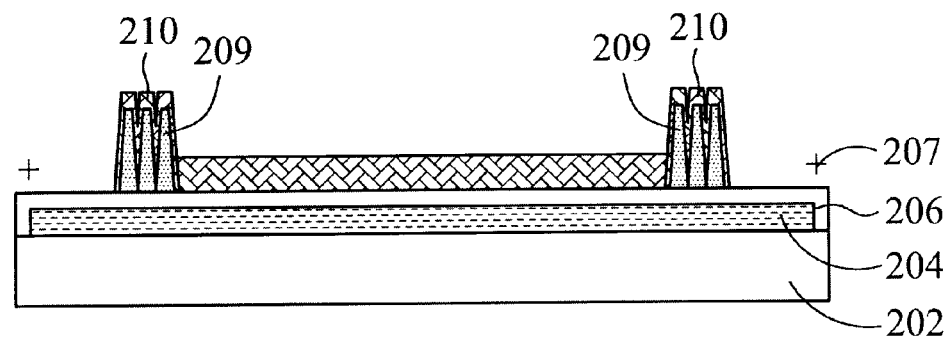

Referring to FIG. 5C, the sidewall barrier layer (SWB layer) 209 is formed on the second flexible substrate 206 and the overcoat 210 is formed on the sidewall barrier layer (SWB layer) 209 and the second flexible substrate 206.

Figure 5D:
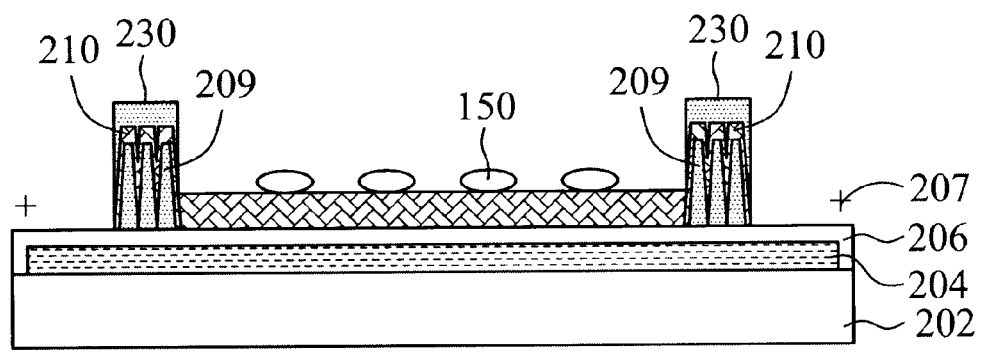

Referring to FIG. 5D, the dam 230 is formed on an edge of the overcoat 210. The material of the dam 230 of the fourth embodiment is the same as that of the first embodiment, and thus is omitted for brevity.

Figure 5E:
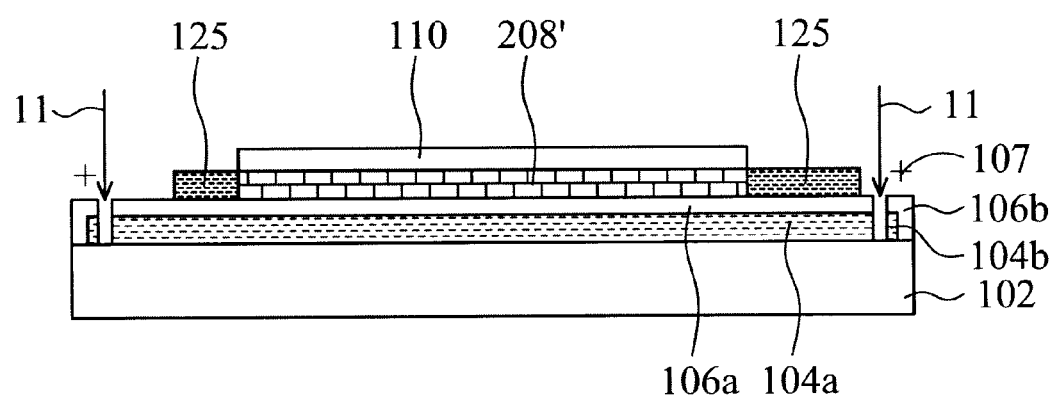

Referring to FIG. 5E, a first cutting step 11 is performed to cut the first de-bonding areas 104 and the first flexible substrate 106. The first de-bonding areas 104 are divided into a first portion 104a and a second portion 104b, and the first flexible substrate 106 is divided into a first portion 106a and a second portion 106b.

Figure 5F:
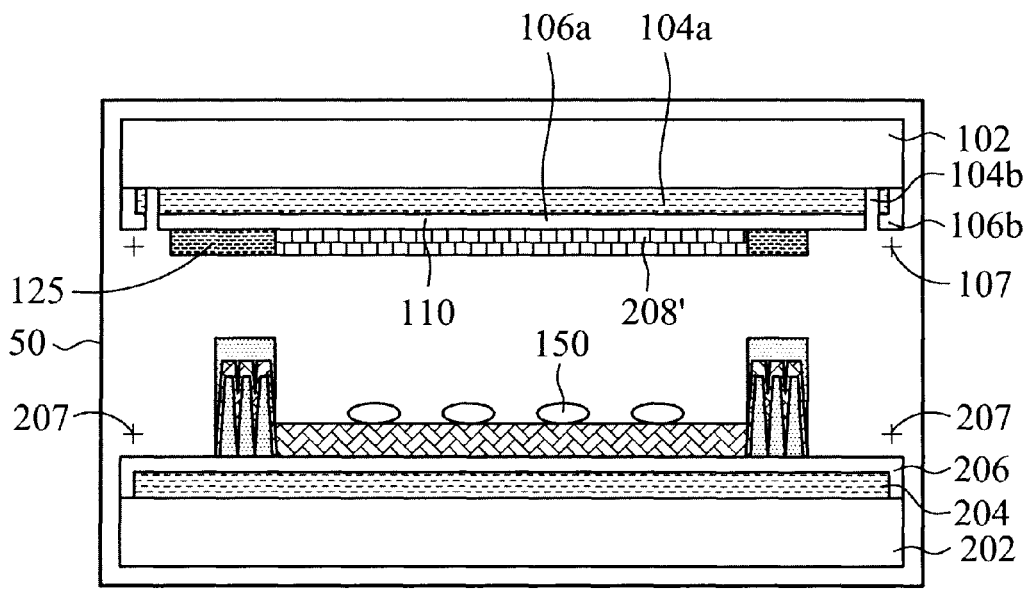

Referring to FIG. 5F, the first rigid carrier substrate 102 and the second rigid carrier substrate 202 are assembled. The assembly of the first rigid carrier substrate 102 and the second rigid carrier substrate 202 are aligned by first alignment mark 107 and second alignment mark 207. The fill 150 is formed between the first rigid carrier substrate 102 and the second rigid carrier substrate 202. The fill 150 is formed between the light emitting unit 110 and the second flexible substrate 206 (206a).

Figure 5G:
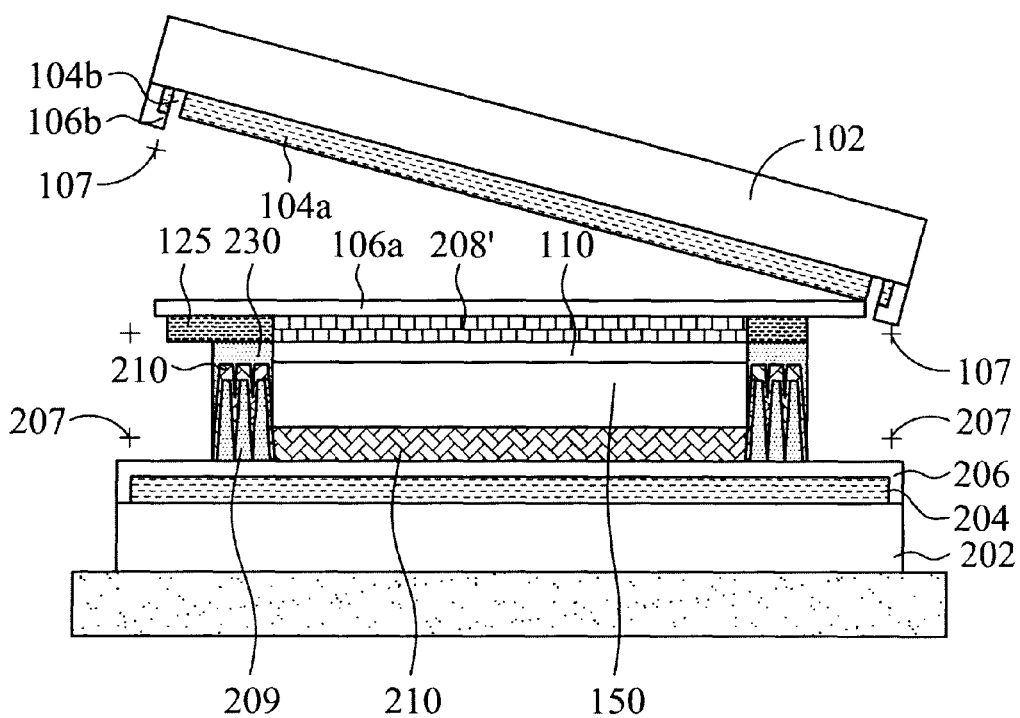

Referring to FIG. 5G, the second rigid carrier substrate 202 is fixed by the immobile device 70, and the immobile device 70 is fixed by a vacuum method, a fixture or an electrostatic chucking method, the first de-bonding area 104 is separated from the first portion 106a of the first flexible substrate 106 to expose a surface of the first portion 106a of the first flexible substrate 106, and the first rigid carrier substrate 102 is removed.

Figure 5H:
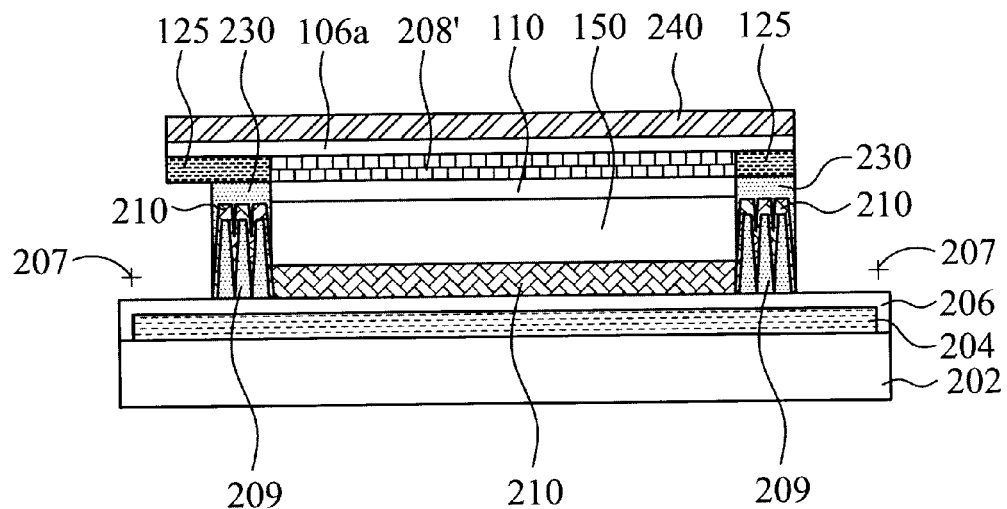
Figure 5I:
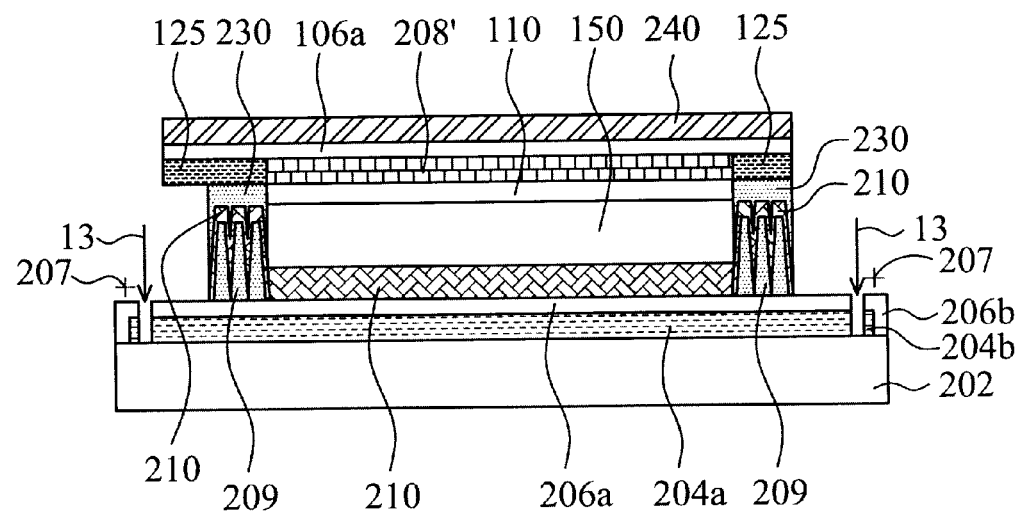

Before performing the step of FIG. 5I, the step of FIG. 5H may be optionally performed, wherein after separating the first de-bonding area 104 from the first portion 106a of the first flexible substrate 106, a surface processing method is performed to a surface of the first portion 106a of the first flexible substrate 106.

The surface processing method comprises adhering a function layer 240 on the exposed surface of the first portion 106a of the first flexible substrate 106. The numbers and the materials of the function layer 240 may be adjusted according to the actual application for those skilled in the art.

Referring to FIG. 5I, a second cutting step 13 is performed to cut the second de-bonding area 204 and the second flexible substrate 206, wherein the second flexible substrate 206 is divided into a third portion 206a and a fourth portion 206b, and wherein the color filter on array (COA) 208' is formed on the third portion 206a of the second flexible substrate 206.

Figure 5J:
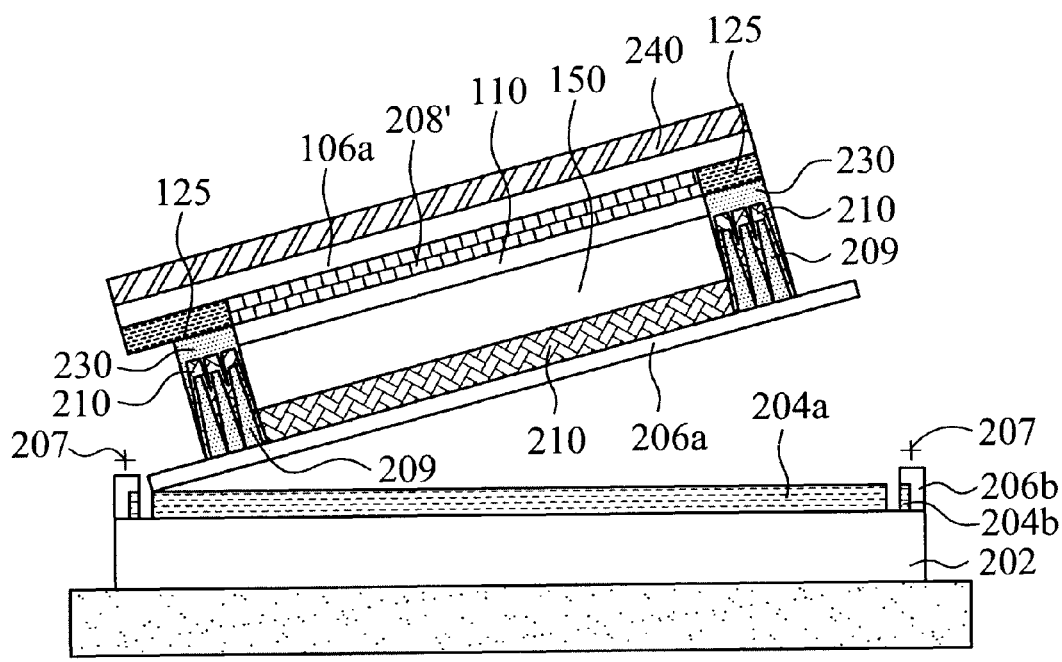

Referring to FIG. 5J, the second de-bonding area 204 is separated from the third portion 206a of the second flexible substrate 206, and the second rigid carrier substrate 202 and the second de-bonding area 204 are removed to form the flexible display 500.

Figure 5K:
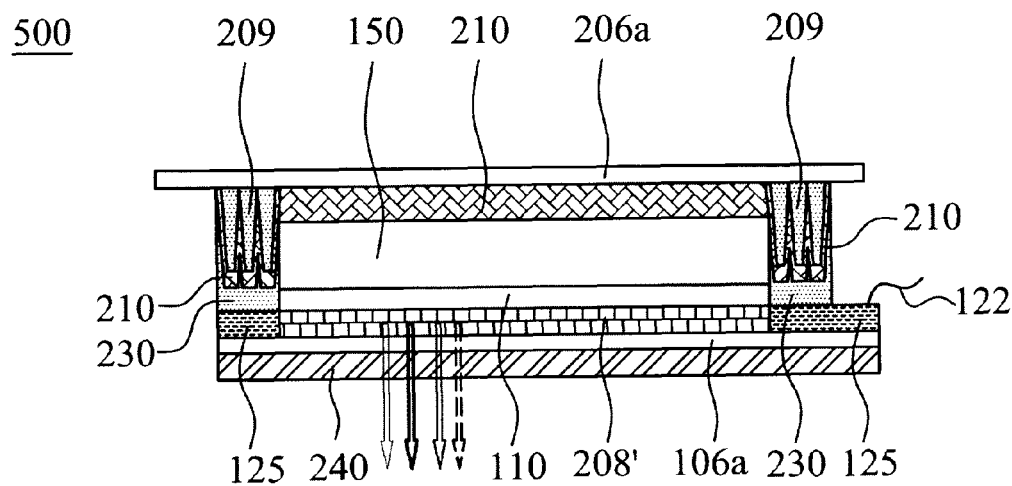

Additionally, referring to FIG. 5K, after the first rigid carrier substrate 102 being removed, the conductive line 125 is exposed outside of dam 230 and is electrically connected to a flexible printed circuit (FPC) 122 bonding. FIG. 5K shows a cross-sectional schematic representation of a bottom emission flexible display 500.

From the above descriptions, the disclosure provides a flexible display and a method for fabricating the same. The flexible display is taken out of the two rigid carrier substrates, and the surface processing method is then performed. Furthermore, the flexible display has a moisture and oxygen blocking function by forming the overcoat and the sidewall barrier layer.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating flexible displays, comprising:
    providing a first rigid carrier substrate, wherein a first de-bonding area, a first flexible substrate, a thin film transistor layer, and a light emitting unit are formed on the first rigid carrier substrate;
    providing a second rigid carrier substrate, wherein a second de-bonding area, a second flexible substrate, and a color filter layer are formed on the second rigid carrier substrate;
    performing a first cutting step to cut the second de-bonding area and the second flexible substrate, wherein the second flexible substrate is divided into a first portion and a second portion;
    assembling the first rigid carrier substrate and the second rigid carrier substrate together;
    fixing the first rigid carrier substrate, and separating the second de-bonding area from the first portion of the second flexible substrate to expose a surface of the first portion of the second flexible substrate, and removing the second rigid carrier substrate and the second de-bonding area;
    performing a second cutting step to cut the first de-bonding area and the first flexible substrate, wherein the first flexible substrate is divided into a third portion and a fourth portion, and the thin film transistor layer is formed on the third portion of the first flexible substrate; and
    separating the first de-bonding area from the third portion of the first flexible substrate, and removing the first rigid carrier substrate and the first de-bonding area to form the flexible display.

2. The method for fabricating flexible displays as claimed in claim 1, further comprising:
    forming a first alignment mark on the first flexible substrate; and
    forming a second alignment mark on the second flexible substrate, wherein the first alignment mark is aligned to the second alignment mark when the first rigid carrier substrate and the second rigid carrier substrate are assembled.

3. The method for fabricating flexible displays as claimed in claim 1, wherein an area of the first de-bonding area is smaller than or equal to an area of the first flexible substrate, and an area of the second de-bonding area is smaller than or equal to an area of the second flexible substrate.

4. The method for fabricating flexible displays as claimed in claim 1, wherein assembling the first rigid carrier substrate and the second rigid carrier substrate together comprises:
    putting the first rigid carrier substrate and the second rigid carrier substrate in a vacuum chamber;
    filling a fill between the first rigid carrier substrate and the second rigid carrier substrate; and
    after the assembling step, removing the first rigid carrier substrate and the second rigid carrier substrate.

5. The method for fabricating flexible displays as claimed in claim 1, before performing the first cutting step, further comprising:
    forming an overcoat on the color filter layer.

6. The method for fabricating flexible displays as claimed in claim 5, after performing the first cutting step, further comprising:
    forming a dam on the first portion of the second flexible substrate, wherein the color filter layer and the light emitting unit are surrounded by the dam and the fill is located inside of the dam.

7. The method for fabricating flexible displays as claimed in claim 5, before forming the overcoat, further comprising:
    forming a sidewall barrier layer (SWB layer) on an edge of the second flexible substrate, wherein the color filter layer is surrounded by the sidewall barrier layer.

8. The method for fabricating flexible displays as claimed in claim 7, after forming the overcoat, wherein the sidewall barrier layer is covered by the overcoat.

9. The method for fabricating flexible displays as claimed in claim 1, further comprising:
    forming a fill between the first rigid carrier substrate and the second rigid carrier substrate, wherein the fill is formed between the light emitting unit and the color filter layer.

10. The method for fabricating flexible displays as claimed in claim 1, after separating the second de-bonding area from the first portion of the second flexible substrate, further comprising:
    processing a surface of the first portion of the second flexible substrate.

11. The method for fabricating flexible displays as claimed in claim 1, further comprising:
    forming a conductive line out of a dam on an edge of the first flexible substrate; and
    after separating the second de-bonding area from the first portion of the second flexible substrate, conductive line electrically connecting to a flexible printed circuit (FPC).

12. A flexible display, comprising:
    a first flexible substrate and a second flexible substrate, wherein the first flexible substrate is disposed oppositely to the second flexible substrate;
    a thin film transistor layer and a light emitting unit formed on the first flexible substrate;
    a color filter layer formed on the second flexible substrate;
    a sidewall barrier layer (SWB layer) formed between the first flexible substrate and the second flexible substrate, wherein the color filter layer and/or light emitting unit is surrounded by the sidewall barrier layer, wherein a height of the sidewall barrier layer is higher than that of the color filter layer;
    an overcoat formed on the sidewall barrier layer (SWB layer) and on the color filter layer; and
    a fill formed between the light emitting unit and the color filter.

13. The flexible display as claimed in claim 12, further comprising:
    a dam formed between the first flexible substrate and the second flexible substrate and surrounding the fill.

14. The flexible display as claimed in claim 13, further comprising:
    a conductive line formed out of the dam on an edge of the first flexible substrate; and
    a flexible printed circuit (FPC) electrically connected to the conductive line.

15. The flexible display as claimed in claim 12, wherein the fill comprises a comprehensive glue.

16. The flexible display as claimed in claim 12, wherein the second flexible substrate has a first surface and a second surface, the color filter layer is formed on the first surface of the second flexible substrate, and a function layer is formed on the second surface of the second flexible substrate.

17. The flexible display as claimed in claim 12, further comprising:

a touch unit formed below the color filter layer.

18. The flexible display as claimed in claim 12, further comprising:

a touch unit formed on the color filter layer.

19. The flexible display as claimed in claim 12, wherein the light emitting unit comprises a white organic light emitting diode (WOLED) or RGB organic light emitting diode (RGB OLED).

* * * * *